United States Patent
Kim et al.

(10) Patent No.: US 12,125,863 B2
(45) Date of Patent: Oct. 22, 2024

(54) DISPLAY APPARATUS HAVING FINGERPRINT RECOGNITION FUNCTION

(71) Applicant: SAMSUNG DISPLAY CO., LTD., Yongin-si (KR)

(72) Inventors: Gee-Bum Kim, Seoul (KR); Chaungi Choi, Suwon-si (KR); Byung Han Yoo, Suwon-si (KR); Dae-Young Lee, Seoul (KR); Yunjong Yeo, Hwaseong-si (KR); Hyunmin Cho, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 169 days.

(21) Appl. No.: 17/364,951

(22) Filed: Jul. 1, 2021

(65) Prior Publication Data
US 2022/0093668 A1 Mar. 24, 2022

(30) Foreign Application Priority Data
Sep. 24, 2020 (KR) .................. 10-2020-0124004

(51) Int. Cl.
*H01L 27/146* (2006.01)
*G06V 40/13* (2022.01)
(Continued)

(52) U.S. Cl.
CPC .... *H01L 27/14623* (2013.01); *G06V 40/1318* (2022.01); *H01L 25/18* (2013.01);
(Continued)

(58) Field of Classification Search
CPC ......... H01L 27/14623; H01L 27/14685; H01L 25/18; H01L 25/50; H01L 25/167; H10K 59/12; H10K 59/40; H10K 59/60; H10K 59/1201; H10K 59/126; G06V 40/1318; G09F 9/33
See application file for complete search history.

(56) References Cited

U.S. PATENT DOCUMENTS 9,829,614 B2 11/2017 Smith et al.
2019/0095674 A1* 3/2019 Ko .................. H01L 31/02327
(Continued)

FOREIGN PATENT DOCUMENTS

| CN | 209543374 | 10/2019 |
|----|-----------|---------|
| CN | 210324241 | 4/2020 |

(Continued)

*Primary Examiner* — Nelson Garces
(74) *Attorney, Agent, or Firm* — F. Chau & Associates, LLC

(57) ABSTRACT

A display apparatus includes a biometric information sensing layer including a sensor, a display module disposed on the biometric information sensing layer and including a plurality of pixels, and an optical pattern layer disposed between the biometric information sensing layer and the display module and including a light shielding part and a transmission part. The light shielding part includes a plurality of light shielding layers. The transmission part has a light transmittance greater than a light transmittance of the light shielding part. A plurality of holes is defined in each of the light shielding layers. The transmission part fills the holes and portions between the light shielding layers.

17 Claims, 18 Drawing Sheets

(51) Int. Cl.
H01L 25/00 (2006.01)
H01L 25/18 (2023.01)
*H10K 59/12* (2023.01)
*H10K 59/40* (2023.01)

(52) U.S. Cl.
CPC ........ H01L 25/50 (2013.01); H01L 27/14685 (2013.01); *H10K 59/12* (2023.02); *H10K 59/40* (2023.02)

(56) References Cited

U.S. PATENT DOCUMENTS

2020/0104562 A1   4/2020  Sung et al.
2021/0365659 A1*  11/2021 Yang ..................... H10K 59/65
2022/0067326 A1*  3/2022  Wang ................ H01L 27/14625

FOREIGN PATENT DOCUMENTS

CN       111291719 A  *  6/2020   ........... G06K 9/0004
KR     1020200038388      4/2020

* cited by examiner

DISPLAY APPARATUS HAVING FINGERPRINT RECOGNITION FUNCTION

CROSS-REFERENCE TO RELATED APPLICATIONS

This U.S. non-provisional patent application claims priority under 35 U.S.C. § 119 of Korean Patent Application No. 10-2020-0124004, filed on Sep. 24, 2020, the disclosure of which is hereby incorporated by reference in its entirety.

TECHNICAL FIELD

Embodiments of the present disclosure relate to a display apparatus having a fingerprint recognition function and a method of manufacturing the same.

DISCUSSION OF RELATED ART

A display apparatus may provide various functions capable of providing a communication interface to a user such as, e.g., displaying an image to provide information to the user or sensing an input of the user. In recent years, a function for detecting a fingerprint of a user has become a common way of providing such a communication interface. A fingerprint recognition method may include a capacitive method of sensing variation in capacitance provided between electrodes, an optical method of sensing incident light by using an optical sensor, or an ultrasonic method of sensing vibration by using a piezoelectric body. A sensing unit for recognizing a fingerprint may be disposed on a rear surface of a display panel in the display apparatus.

SUMMARY

Embodiments of the present disclosure provide a display apparatus including a sensing unit having increased fingerprint recognition sensitivity and a method of manufacturing the same.

According to an embodiment of the inventive concept, a display apparatus includes a biometric information sensing layer including a sensor, a display module disposed on the biometric information sensing layer and including a plurality of pixels, and an optical pattern layer disposed between the biometric information sensing layer and the display module and including a light shielding part and a transmission part. The light shielding part includes a plurality of light shielding layers. The transmission part has a light transmittance greater than a light transmittance of the light shielding part. A plurality of holes is defined in each of the light shielding layers. The transmission part fills the holes and portions between the light shielding layers.

In an embodiment, the plurality of light shielding layers includes a first light shielding layer, a second light shielding layer, and a third light shielding layer, the plurality of holes includes a plurality of first holes defined in the first light shielding layer, a plurality of second holes defined in the second light shielding layer, and a plurality of third holes defined in the third light shielding layer, and the first holes, the second holes, and the third holes are aligned in a thickness direction of the light shielding part.

In an embodiment, the first to third holes have the same width as each other on a plane.

In an embodiment, the first to third holes have the same shape as each other on the plane.

In an embodiment, the first holes and the second holes have different widths from each other on a plane.

In an embodiment, the first holes and the second holes are arranged with a same pitch as each other.

In an embodiment, a width of each of the first holes is greater than each of a width of each of the second holes and a width of each of the third holes, and the width of each of the third holes is less than the width of each of the second holes.

In an embodiment, gaps between the light shielding layers are about the same as each other.

In an embodiment, gaps between the light shielding layers are different from each other.

In an embodiment, the light shielding part includes at least one of molybdenum, titanium, or aluminum.

In an embodiment, each of the light shielding layers has a multi-layer structure.

In an embodiment, the light shielding part includes chrome or carbon.

In an embodiment, a portion of the transmission part covers a top surface of the light shielding part.

According to an embodiment of the inventive concept, a display apparatus includes a display module including a plurality of pixels, and a sensing unit including a biometric information sensing layer disposed below the display module and an optical pattern layer disposed on the biometric information sensing layer. The optical pattern layer includes a first light shielding layer in which a plurality of first holes overlapping at least a portion of the pixels in a plan view is defined, a second light shielding layer in which a plurality of second holes overlapping the first holes, respectively, is defined, a third light shielding layer in which a plurality of third holes overlapping the second holes, respectively, is defined, and a transmission part disposed between the first to third light shielding layers. The transmission part fills each of the first to third holes, and each of the first to third light shielding layers includes at least one of molybdenum, titanium, or aluminum.

In an embodiment, the transmission part has an integrated shape.

In an embodiment, the transmission part covers a top surface of the third light shielding part.

In an embodiment, the first to third holes are aligned in a thickness direction of the first to third light shielding layers.

According to an embodiment of the inventive concept, a method of manufacturing a display apparatus includes forming a sensing unit, and coupling the sensing unit to a lower side of a display module. Forming the sensing unit includes alternately laminating a plurality of transmission layers and a plurality of initial light shielding layers on a base layer, forming a mask in which a plurality of first holes is formed in an uppermost surface of the initial light shielding layers, forming a plurality of second holes corresponding to the first holes in the initial light shielding layers and the transmission layers, and forming a transmission part by filling a light transmission material in the second holes.

In an embodiment, the second holes defined in the initial light shielding layers and the transmission layers are formed through a dry etching process.

In an embodiment, the transmission layers and the light shielding layers are etched by the same etching gas.

BRIEF DESCRIPTION OF THE DRAWINGS

The above and other features of the present inventive concept will become more apparent by describing in detail embodiments thereof with reference to the accompanying drawings, in which.

DETAILED DESCRIPTION

Figure 1:
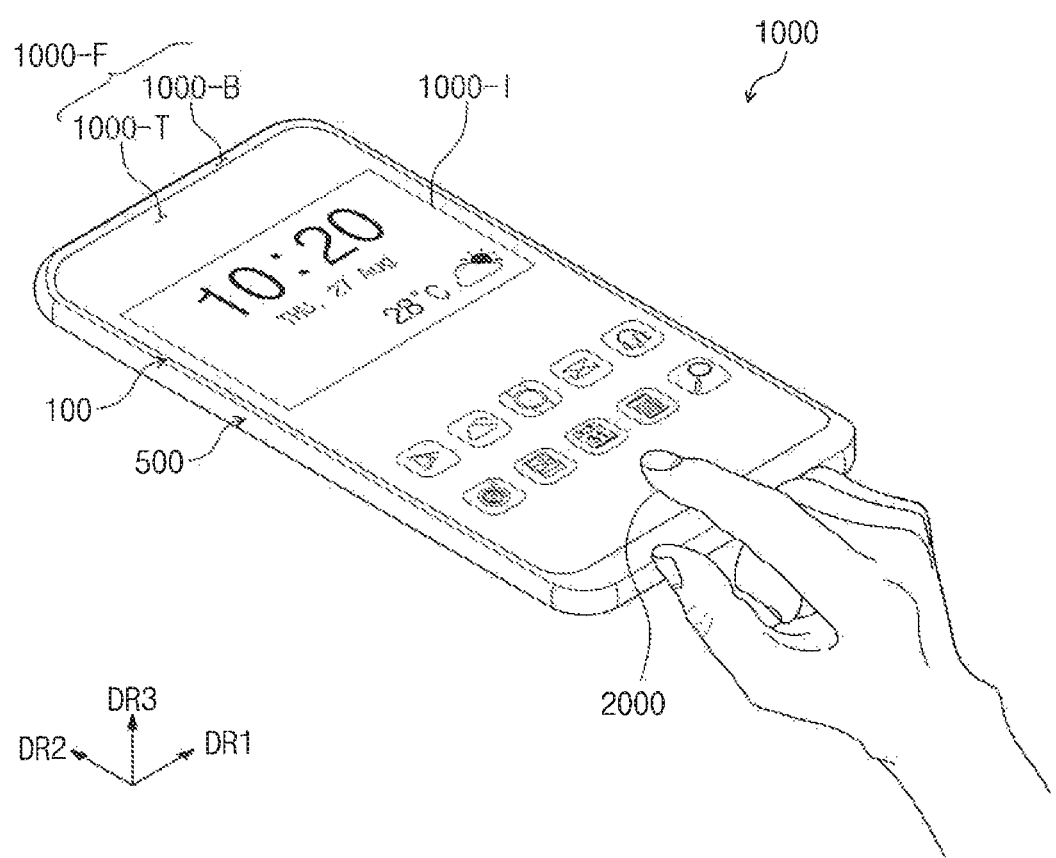
FIG. 1 is a perspective view of a display apparatus according to an embodiment of the inventive concept.

Embodiments of the present inventive concept will be described more fully hereinafter with reference to the accompanying drawings. Like reference numerals may refer to like elements throughout the accompanying drawings.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

The term "and/or" includes any and all combinations of one or more of the associated listed items.

It will be understood that the terms "first," "second," "third," etc. are used herein to distinguish one element from another, and the elements are not limited by these terms. Thus, a "first" element in an embodiment may be described as a "second" element in another embodiment.

The terms of a singular form may include plural forms unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, for example, the terms "below" and "under" can encompass both an orientation of above and below.

The meaning of 'include' or 'comprise' specifies a property, a fixed number, a step, an operation, an element, a component or a combination thereof, but does not exclude other properties, fixed numbers, steps, operations, elements, components or combinations thereof.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Figure 2:
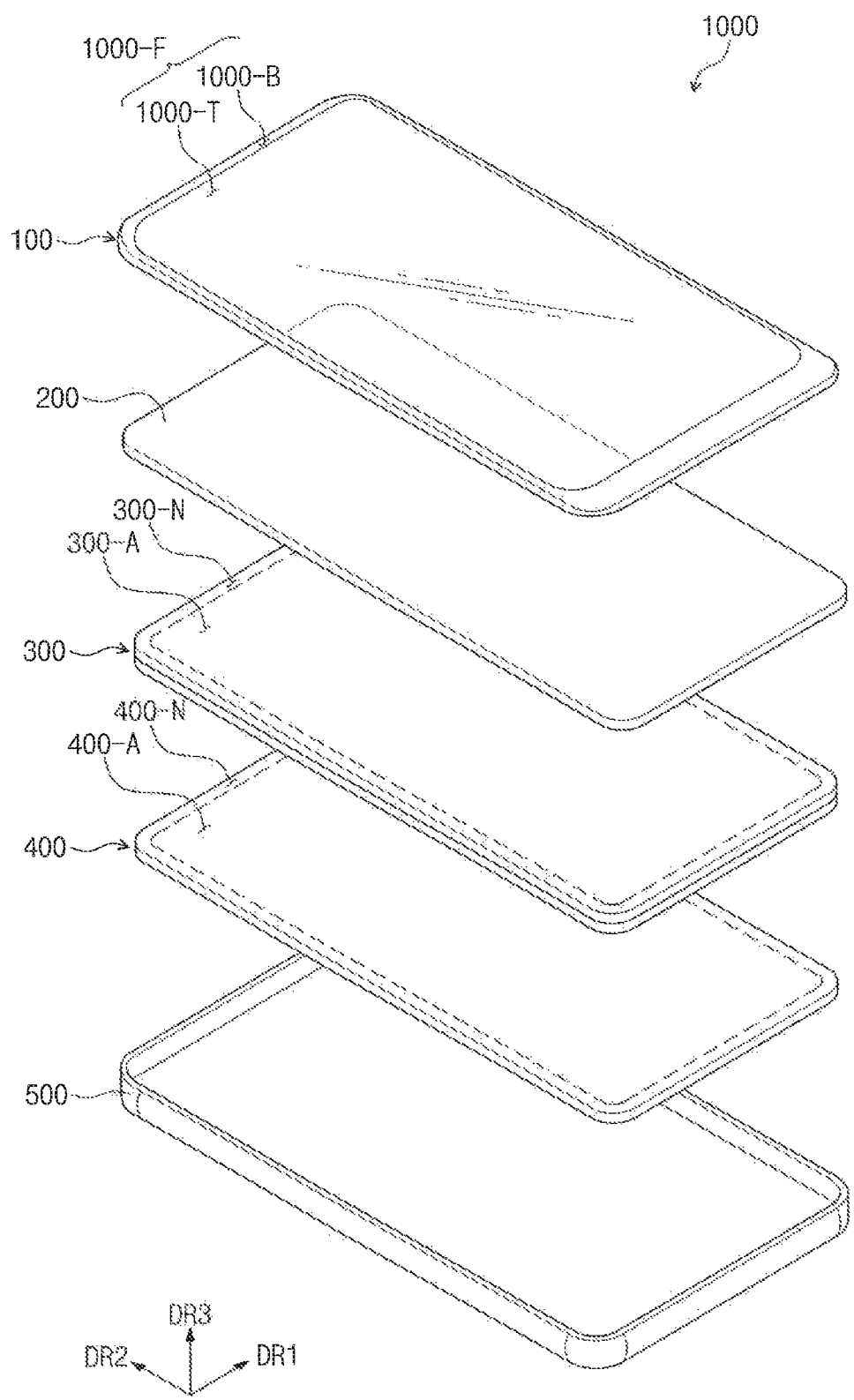
FIG. 2 is an exploded perspective view of the display apparatus according to an embodiment of the inventive concept.

FIG. 1 is a perspective view of a display apparatus according to an embodiment of the inventive concept. FIG. 2 is an exploded perspective view of the display apparatus according to an embodiment of the inventive concept.

Referring to FIGS. 1 and 2, a display apparatus 1000 may be activated by an electrical signal. The display apparatus 1000 may include various embodiments. For example, the display apparatus 1000 may be used for large-sized electronic devices such as televisions, monitors, or outdoor advertisement boards, and small and medium-sized electronic devices such as personal computers, notebook computers, personal digital terminals, navigation units for vehicles, game consoles, portable electronic devices, and cameras. The above-described devices are merely embodiments, and thus, the display apparatus may be adopted to other electronic devices. In an embodiment described herein, a smartphone is illustrated as an example of the display apparatus 1000.

The display apparatus 1000 may display an image 1000-I in a third direction DR3 on a display surface 1000-F in parallel to each of a first direction DR1 and a second direction DR2. The image 1000-I may include a still image as well as a video. In FIG. 1, a clock window and icons are illustrated as an example of the image 1000-I. The display surface 1000-F, on which the image 1000-I is displayed, may correspond to each of a front surface of the display apparatus 1000 and a front surface of a window 100.

In an embodiment, a front surface (or a top surface) and a rear surface (or a bottom surface) of each of members are defined based on a direction in which the image 1000-I is displayed. The front surface and the rear surface may be opposite to each other in the third direction DR3, and a normal direction of each of the front surface and the rear surface may be parallel to the third direction DR3. In this specification, an expression "when viewed on a plane" may mean "when viewed in the third direction DR3".

The display apparatus 1000 according to an embodiment of the inventive concept may sense an input of a user. For example, the input of the user may include various types of external inputs such as a portion of a user's body, light, heat, or pressure. Also, the display apparatus 1000 may sense the input of the user applied to a side surface or a rear surface of the display apparatus 1000 according to a structure of the display apparatus 1000. However, embodiments of the inventive concept are not limited thereto.

The display apparatus 1000 may sense a fingerprint 2000 of the user applied to the display apparatus 1000. A fingerprint recognition area may be provided by the display surface 1000-F of the display apparatus 1000. The fingerprint recognition area may be provided in an entire area or a partial area of a transmission area 1000-T.

The display apparatus 1000 may include a window 100, an anti-reflection panel 200, a display module 300, a sensing unit 400, and a housing 500. In an embodiment, the window 100 and the housing 500 may be coupled to each other provide an appearance of the display apparatus 1000.

The window 100 may include an optically clear insulating material. For example, the window 100 may include glass or plastic. The window 100 may have a multi-layer structure or a single-layer structure. For example, the window 100 may include a plurality of plastic films coupled by an adhesive or a glass substrate and a plastic film, which are coupled by an adhesive.

As described above, the front surface of the window 100 defines the display surface 1000-F of the display apparatus 1000. The transmission area 1000-T may be an optically clear area. For example, the transmission area 1000-T may have a visible light transmittance of about 90% or more.

A bezel area 1000-B may have a relatively lower light transmittance than that of the transmission area 1000-T. The bezel area 1000-B defines a shape of the transmission area 1000-T. The bezel area 1000-B may be disposed adjacent to the transmission area 1000-T to surround the transmission area 1000-T.

The bezel area 1000-B may have a predetermined color. The bezel area 1000-B may cover a peripheral area 300-N of the display module 300 to block the peripheral area 300-N from being recognized by a user. However, this is merely illustrative. For example, the bezel area 1000-B may be omitted from the window 100 according to an embodiment of the inventive concept.

The anti-reflection panel 200 may be disposed below the window 100. The anti-reflection panel 200 reduces a reflectance of external light incident from above the window 100. In an embodiment of the inventive concept, the anti-reflection panel 200 may be omitted or contained in the display module 300.

The display module 300 may display the image 1000-I and sense an external input. The display module 300 may include an active area 300-A and the peripheral area 300-N. The active area 300-A may be activated by an electric signal.

In an embodiment, the active area 300-A may be an area on which the image 1000-I is displayed and an external input is sensed at the same time. The transmission area 1000-T may overlap the active area 300-A. For example, the transmission area 1000-T may overlap an entire area or at least a partial area of the active area 300-A. Thus, a user may recognize the image 1000-I through the transmission area 1000-T or provide an external input. In an embodiment of the inventive concept, the active area 300-A may be divided into an area on which the image 1000-I is displayed and an area in which an external input is sensed. However, embodiments of the inventive concept are not limited thereto.

The peripheral area 300-N may be covered by the bezel area 1000-B. The peripheral area 300-N is disposed adjacent to the active area 300-A. The peripheral area 300-N may surround the active area 300-A. A driving circuit or a driving line for driving the active area 300-A may be disposed on the peripheral area 300-N.

The sensing unit 400 may be disposed below the display module 300. The sensing unit 400 may be a layer that senses biometric information of the user. The sensing unit 400 may sense a surface of a touched object. The surface may be uniform or wavy. For example, the surface may include information of the fingerprint 2000 of the user.

The sensing unit 400 may include a sensing area 400-A and a non-sensing area 400-N. The sensing area 400-A may be activated by an electric signal. For example, the sensing area 400-A may sense biometric information. A driving circuit or a driving line for driving the sensing area 400-A may be disposed on the non-sensing area 400-N.

In an embodiment of the inventive concept, the sensing area 400-A may overlap the entire active area 300-A. In this case, fingerprint recognition may be performed over the entire active area 300-A. That is, the fingerprint of the user may be recognized over the entire area instead of only a partial area that is restricted to a specific area. However, embodiments of the inventive concept are not limited thereto. For example, in an embodiment of the inventive concept, the sensing unit 400 may overlap a portion of the active area 300-A.

The housing 500 is coupled to the window 100. The housing 500 is coupled to the window 100 to provide a predetermined inner space. The display module 300 and the sensing unit 400 may be accommodated in the inner space. The housing 500 may stably protect components of the display apparatus 1000 accommodated in the inner space from an external impact. The housing 500 may include a relatively highly rigid material. For example, the housing 500 may include a plurality of frames and/or plates, which are made of, for example, glass, plastic, metal, or a combination thereof.

In an embodiment, a battery module or the like that supplies power necessary for overall operation of the display apparatus 1000 may be disposed between the sensing unit 400 and the housing 500.

Figure 3:
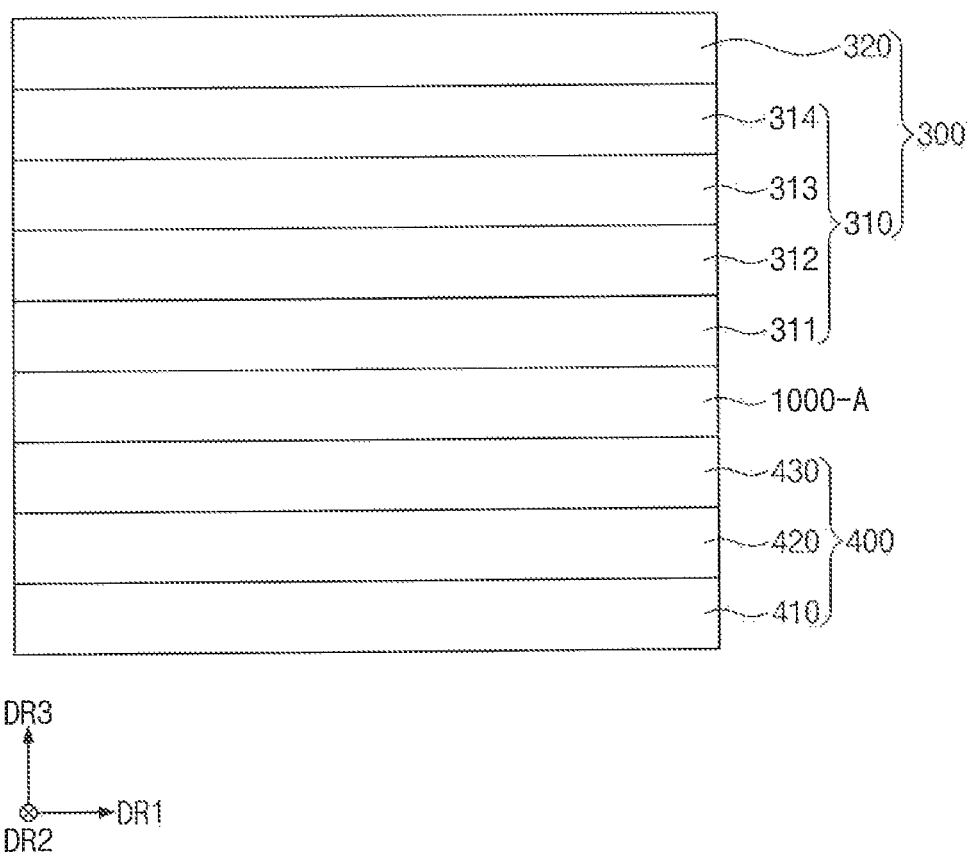
FIG. 3 is a schematic cross-sectional view of a display apparatus according to an embodiment of the inventive concept.

FIG. 3 is a cross-sectional view of a portion of the components of a display apparatus according to an embodiment of the inventive concept. FIG. 3 is a schematic cross-sectional view illustrating components constituting the display module 300 and the sensing unit 400.

Referring to FIG. 3, the display module 300 may include a display panel 310 and an input sensing layer 320.

The display panel 310 may be a layer that provides an image. The active area 300-A (refer to FIG. 2) of the display module 300 may correspond to an active area of the display panel 310. That is, the sensing area 400-A (refer to FIG. 2) of the sensing unit 400 may correspond to the entire active area of the display panel 310.

The display panel 310 may include a base layer 311, a circuit layer 312, a light emitting device layer 313, and an encapsulation layer 314.

The base layer 311 may include a synthetic resin film. The synthetic resin layer may include a thermosetting resin. Although the synthetic resin layer may particularly include a polyimide-based resin layer, embodiments of the inventive concept are not limited thereto. The synthetic resin layer may include at least one of, for example, an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. The base layer may include, for example, a glass substrate, a metal substrate, or an organic/inorganic composite substrate.

The circuit layer 312 may be disposed on the base layer 311. The circuit layer 312 may include a pixel circuit and insulation layers. The pixel circuit may include at least one transistor and at least one capacitor.

The light emitting device layer 313 may be disposed on the circuit layer 312. The light emitting device layer 313 may generate light. The light emitting device layer 313 may generate light or control a light quantity according to an electrical signal. When the display panel 310 is an organic light emitting display panel, the light emitting device layer 313 may include an organic light emitting material. Alternatively, when the display panel 310 is a quantum dot light emitting display panel, the light emitting device layer 313 may include a quantum dot or a quantum rod. Alternatively, the light emitting device layer 313 may include a micro-LED or a nano-LED. The light emitting device layer 313 may include various embodiments capable of generating light or controlling a light quantity according to an electrical signal. However, embodiments of the inventive concept are not limited thereto.

The encapsulation layer 314 may be disposed on the light emitting device layer 313. The encapsulation layer 314 may include at least one insulation layer. For example, the encapsulation layer 314 may include at least one inorganic layer and at least one organic layer. The inorganic layer may protect the light emitting device layer 313 from, for example, moisture and oxygen, and the organic layer may protect the light emitting device layer 313 from foreign substances such as, for example, dust particles.

The input sensing layer 320 may be disposed on the display panel 310. The input sensing layer 320 may sense an external input to acquire coordinate information of the external input. The external input may include various inputs. For example, the external input may include various types of external inputs such as a portion of a user's body, light, heat, or pressure. The input sensing layer 320 may sense an input contacting the window 100 (refer to FIG. 2) or an input that is nearby or adjacent to (e.g., without contacting) the window 100.

The input sensing layer 320 may be directly disposed on (e.g., may directly contact) the display panel 310. For example, the input sensing layer 320 and the display panel 310 may be provided through a continuous process. In an embodiment of the inventive concept, the input sensing layer 320 may be attached to the display panel 310. In this case, an adhesive layer may be further disposed between the input sensing layer 320 and the display panel 310.

The sensing unit 400 may be disposed below the display module 300. For example, the sensing unit 400 may be attached to a rear surface of the display panel 310. An adhesive layer 1000-A may be disposed between the sensing unit 400 and the display panel 310. The adhesive layer 1000-A may be an optically clear adhesive member and may include a typical adhesive or bonding agent.

The sensing unit 400 may include a base layer 410, a biometric information sensing layer 420, and an optical pattern layer 430.

The base layer 410 may include a synthetic resin layer. The synthetic resin layer may include a thermosetting resin. Although the synthetic resin layer may particularly include a polyimide-based resin layer, embodiments of the inventive concept are not limited thereto. For example, in an embodiment, the base layer 410 may include two layers of polyimide-based resin layers and a barrier layer disposed between the polyimide-based resin layers. The barrier layer may include, for example, amorphous silicon and silicon oxide.

The biometric information sensing layer 420 may be disposed on the base layer 410. The biometric information sensing layer 420 may include a sensing circuit and insulation layers. The sensing circuit may include at least one transistor and at least one photodiode. The display module 300 may be disposed on the sensing unit 400, and thus, may be disposed on the biometric information sensing layer 420.

The optical pattern layer 430 may be directly disposed on (e.g., may directly contact) the biometric information sensing layer 420. For example, the optical pattern layer 430 and the biometric information sensing layer 420 may be provided through a continuous process. The optical pattern layer 430 may filter light incident to the biometric information sensing layer 420. For example, an incident angle of light capable of being transmitted through the optical pattern layer 430 may be controlled by the optical pattern layer 430. For example, the incident angle may be restricted to be about equal to or less than a predetermined angle. As the incident angle is restricted, a fingerprint recognition accuracy may be increased.

Figure 4:
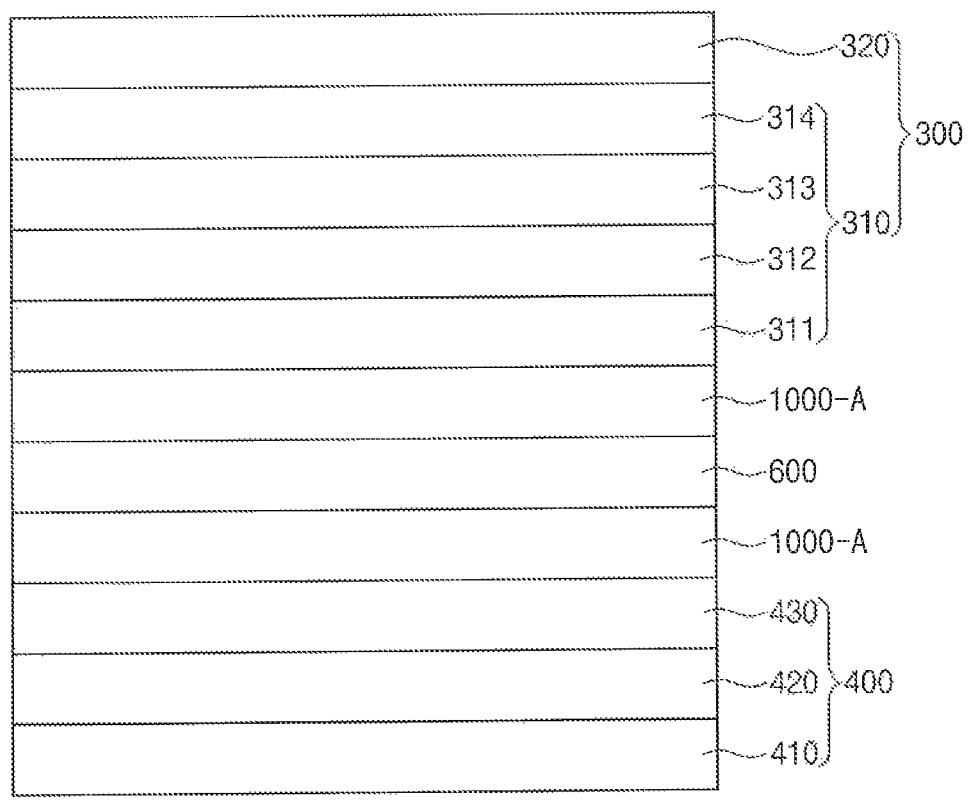
FIG. 4 is a schematic cross-sectional view of a display apparatus according to an embodiment of the inventive concept.
Figure 4:
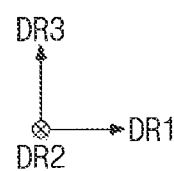

FIG. 4 is a schematic cross-sectional view illustrating a portion of the components of a display apparatus according to an embodiment of the inventive concept. In FIG. 4, components different from those in FIG. 3 will be mainly described, and for convenience of explanation, a further description of components and technical aspects previously described will be omitted.

Referring to FIG. 4, an infrared filter 600 may be further disposed between a display module 300 and a sensing unit 400. The infrared filter 600 may prevent infrared light from being transmitted therethrough and may allow visible light to be transmitted therethrough.

Light reflected by the fingerprint 2000 (refer to FIG. 1) of the user may be visible light. According to an embodiment, as the infrared filter 600 blocks light having a wavelength band that is different from that of the light reflected by the fingerprint 2000, fingerprint recognition accuracy of the biometric information sensing layer 420 may be increased.

An adhesive layer 1000-A may be disposed between the infrared filter 600 and the display module 300 and between the infrared filter 600 and the sensing unit 400.

Figure 5:
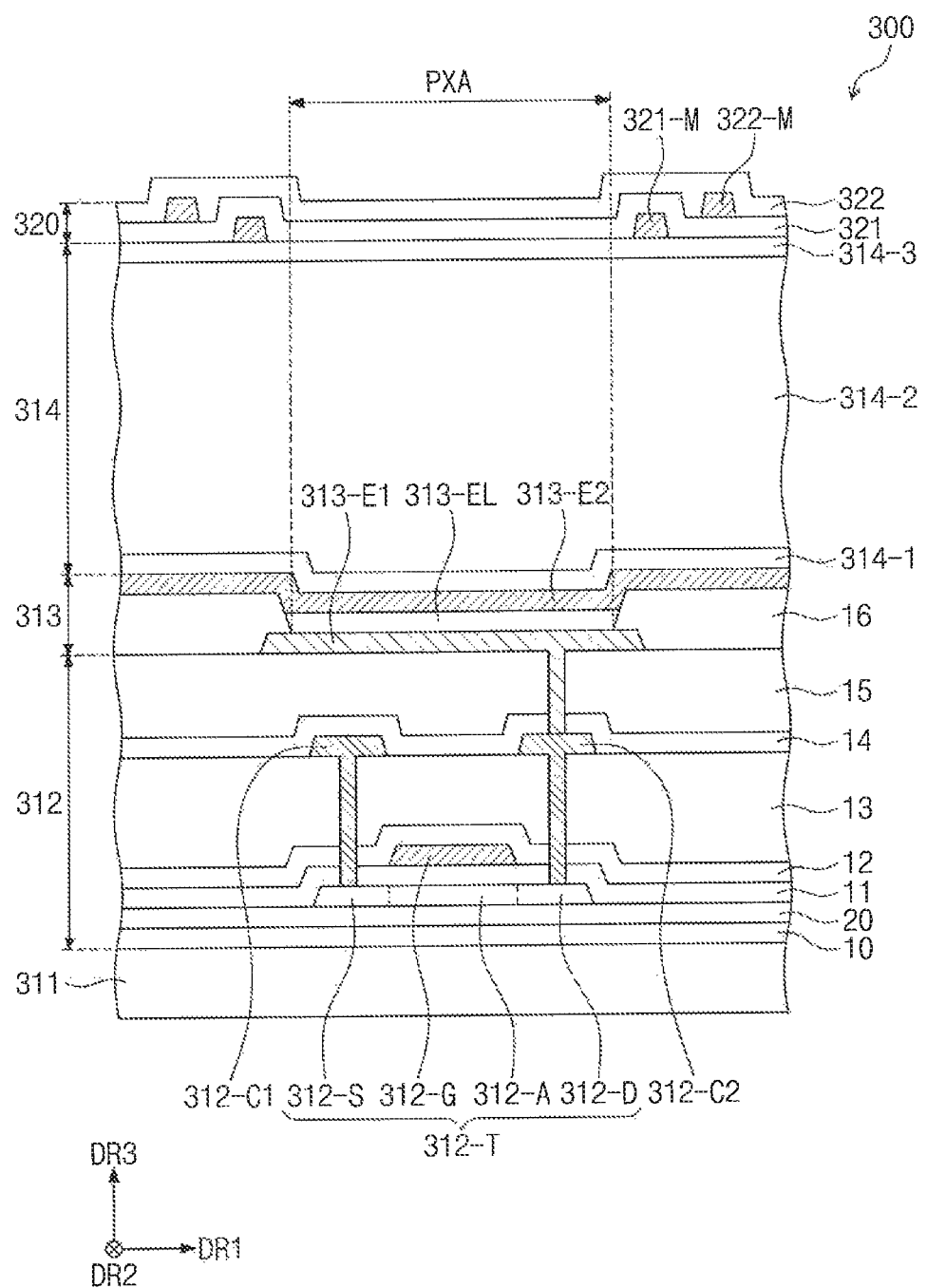
FIG. 5 is a cross-sectional view of a display module according to an embodiment of the inventive concept.

FIG. 5 is a cross-sectional view of the display module 300 according to an embodiment of the inventive concept.

Referring to FIG. 5, a circuit layer 312, a light emitting device layer 313, an encapsulation layer 314, and an input sensing layer 320 may be sequentially disposed on a base layer 311. The display module 300 may include a light emitting area PXA.

A barrier layer 10 may be disposed on the base layer 311. The barrier layer 10 may prevent foreign substances from being introduced from outside of the display module 300. The barrier layer 10 may include at least one of, for example, a silicon oxide layer or a silicon nitride layer. Each of the silicon oxide layer and the silicon nitride layer may be provided in plurality, and the silicon oxide layers and the silicon nitride layers may be alternately laminated with each other.

A buffer layer 20 may be disposed on the barrier layer 10. The buffer layer 20 may increase a coupling force between the base layer 311 and a semiconductor pattern and/or a conductive pattern. The buffer layer 20 may include at least one of, for example, a silicon oxide layer or a silicon nitride layer. The silicon oxide layer and the silicon nitride layer may be alternately laminated with each other.

A transistor 312-T of the pixel circuit may be disposed on the buffer layer 20. The transistor 312-T may include an active region (or channel) 312-A, a source 312-S, a drain 312-D, and a gate 312-G.

A semiconductor pattern including the source 312-S, the active region (or channel) 312-A, and the drain 312-D is disposed on the buffer layer 20. In an embodiment, the semiconductor pattern including the source 312-S, the active region (or channel) 312-A, and the drain 312-D directly disposed on the buffer layer 20 may include a silicon semiconductor, and may further include a polysilicon semiconductor or an amorphous silicon semiconductor. Alternatively, in an embodiment, the semiconductor pattern including the source 312-S, the active region (or channel) 312-A, and the drain 312-D may include an oxide semiconductor or an organic semiconductor. The semiconductor pattern including the source 312-S, the active region (or channel) 312-A, and the drain 312-D according to an embodiment of the inventive concept may include various materials having a semiconductor property. However, embodiments of the inventive concept are not limited thereto.

The semiconductor pattern including the source 312-S, the active region (or channel) 312-A, and the drain 312-D may have a different electrical property depending on doping. For example, the semiconductor pattern may include a doped area and a non-doped area. The doped area may be doped with an n-type dopant or a p-type dopant. For example, a p-type transistor includes a doped area that is doped with the p-type dopant, and an n-type transistor includes a doped area that is doped with the n-type dopant.

The doped area may have conductivity greater than that of the non-doped area and may substantially serve as an electrode or a signal line. The non-doped area substantially corresponds to an active region (or channel) of the transistor. In other words, a portion of the semiconductor pattern may be the active region (or channel) 312-A of the transistor 312-T, another portion may be the source 312-S or the drain 312-D of the transistor 312-T, and another portion may be a connection signal line (or a connection electrode).

A first insulation layer 11 may be disposed on the buffer layer 20 and may cover the semiconductor pattern including the source 312-S, the active region (or channel) 312-A, and the drain 312-D. The first insulation layer 11 may be an inorganic layer and/or an organic layer and may have a single-layer or multi-layer structure. The first insulation layer 11 may include at least one of, for example, aluminum oxide, titanium oxide, silicon oxide, silicon oxide nitride, zirconium oxide, or hafnium oxide. In an embodiment, the first insulation layer 11 may be a single-layered silicon oxide layer. The inorganic layer, which will be described later, may include at least one of the above-described materials.

The gate 312-G may be disposed on the first insulation layer 11. The gate 312-G may be a portion of a metal pattern. On a plane, the gate 312-G may overlap the active region (or channel) 312-A. The gate 312-G may function as a mask in a process of doping the semiconductor pattern.

A second insulation layer 12 may be disposed on the first insulation layer 11 and may cover the gate 312-G. The second insulation layer 12 may be an inorganic layer and may have a single-layer or multi-layer structure. In an embodiment, the second insulation layer 12 may be a single-layered silicon oxide layer.

A third insulation layer 13 may be disposed on the second insulation layer 12. The third insulation layer 13 may be an organic layer and may have a single-layer or multi-layer structure. For example, the third insulation layer 13 may be a single-layered polyimide-based resin layer. However, embodiments of the inventive concept are not limited thereto. For example, the third insulation layer 13 may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. The organic layer, which will be described later, may include at least one of the above-described materials.

A first connection electrode 312-C1 and a second connection electrode 312-C2 may be disposed on the third insulation layer 13. Each of the first connection electrode 312-C1 and the second connection electrode 312-C2 may pass through the first to third insulation layers 11, 12, and 13 and may be electrically connected to the transistor 312-T.

A fourth insulation layer 14 may be disposed on the third insulation layer 13 and may cover the first connection electrode 312-C1 and the second connection electrode 312-C2. The fourth insulation layer 14 may be an inorganic layer.

A fifth insulation layer 15 may be disposed on the fourth insulation layer 14. The fifth insulation layer 15 may be an organic layer and may have a single-layer or multi-layer structure.

The light emitting device layer 313 may be disposed on the fifth insulation layer 15. The light emitting device layer 313 may include a first electrode 313-E1, a light emitting layer 313-EL, and a second electrode 313-E2. The first electrode 313-E1 may pass through the fourth insulation layer 13 and the fifth insulation layer 15 and may be electrically connected to the transistor 312-T.

A pixel defining layer 16 may be disposed on the fifth insulation layer 15. An opening exposing the first electrode 313-E1 may be defined in the pixel defining layer 16. The opening may have a shape corresponding to the light emitting area PXA on the plane.

The light emitting layer 313-EL may be disposed on the first electrode 313-E1. The light emitting layer 313-EL may provide light having a predetermined color. Although the light emitting layer 313-EL having a patterned single-layer is exemplarily illustrated in FIG. 5, embodiments of the inventive concept are not limited thereto. For example, the light emitting layer 313-EL may have a multi-layer structure. The light emitting layer 313-EL may extend toward a top surface of the pixel defining layer 16.

The second electrode 313-E2 may be disposed on the light emitting layer 313-EL. In an embodiment, an electron control layer may be disposed between the second electrode 313-E2 and the light emitting layer 313-EL, and a hole control layer may be disposed between the first electrode 313-E1 and the light emitting layer 313-EL.

In an embodiment of the inventive concept, each of the first electrode 313-E1 and the second electrode 313-E2 may include a transparent conductive material. For example, each of the first electrode 313-E1 and the second electrode 313-E2 may include at least one of indium-tin oxide (ITO), indium-zinc-oxide (MO), indium-gallium oxide (IGO), indium-zinc-gallium oxide (IGZO), or a mixture/compound thereof. However, embodiments of the inventive concept are not limited thereto.

The encapsulation layer 314 may be disposed on the second electrode 313-E2. The encapsulation layer 314 may include a first inorganic layer 314-1, an organic layer 314-2, and a second inorganic layer 314-3.

The first inorganic layer 314-1 may be disposed on the second electrode 313-E2. The organic layer 314-2 may be disposed on the first inorganic layer 314-1. The second inorganic layer 314-3 may be disposed on the organic layer 314-2 and may cover the organic layer 314-2. Each of the first inorganic layer 314-1 and the second inorganic layer 314-3 may include, for example, a silicon nitride layer, a silicon oxynitride layer, a silicon oxide layer, a titanium oxide layer, or an aluminum oxide layer. However, embodiments of the inventive concept are not limited thereto. Although the organic layer 314-2 may include an acrylic-based organic layer, embodiments of the inventive concept are not limited thereto. The first inorganic layer 314-1 and the second inorganic layer 314-3 may protect the light emitting layer 313-EL from, for example, moisture/oxygen, and the organic layer 314-2 may protect the light emitting layer 313-EL from foreign substances such as, for example, dust particles.

The input sensing layer 320 may be disposed on the encapsulation layer 314. The input sensing layer 320 may include a first conductive layer 321-M, a first sensing insulation layer 321, a second conductive layer 322-M, and a second sensing insulation layer 322. At least one of the first conductive layer 321-M and the second conductive layer 322-M may include sensing electrodes. The input sensing layer 320 may obtain information on an external input through variation of a capacitance between the sensing electrodes.

Figure 6A:
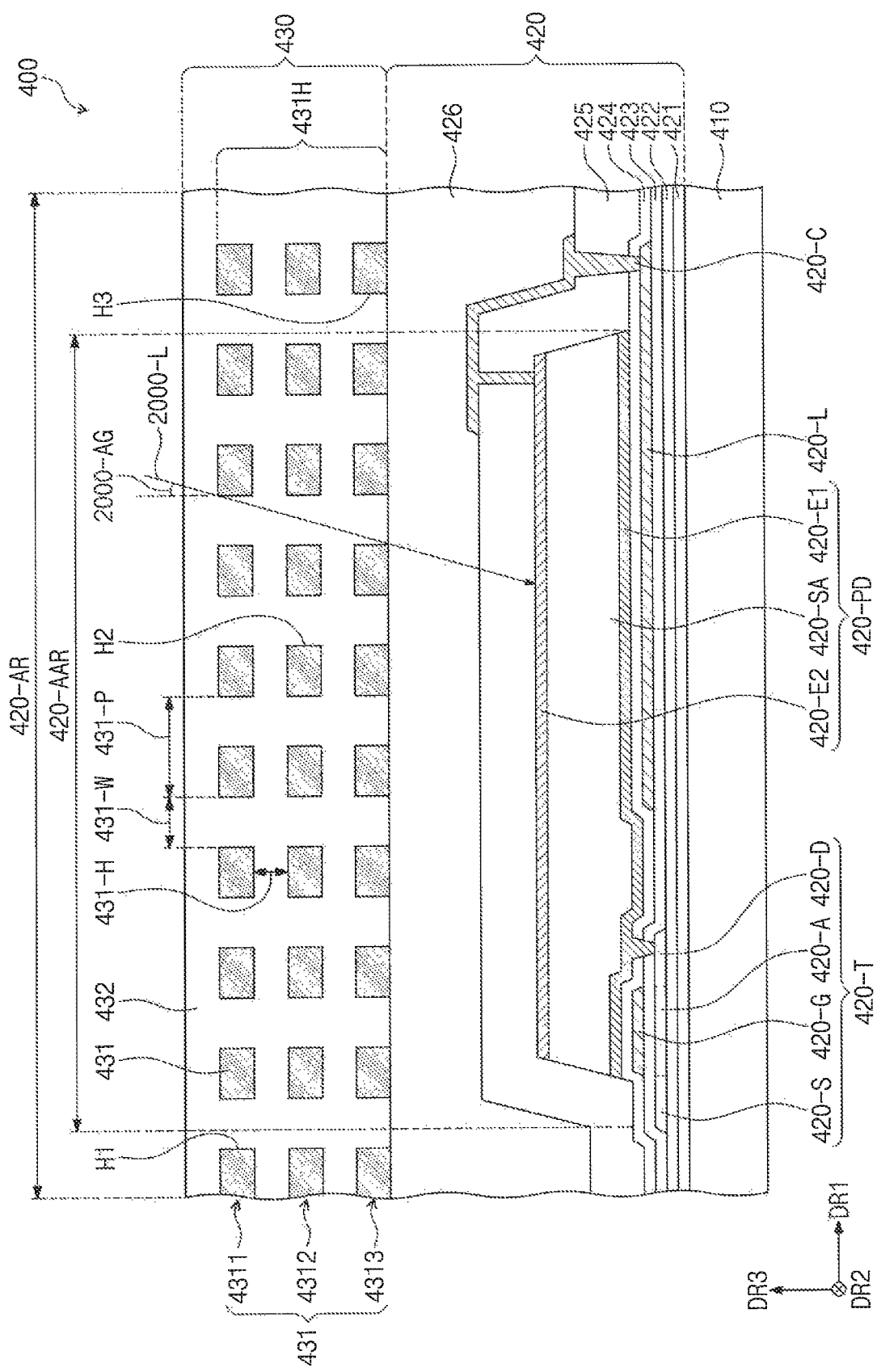
FIG. 6A is a cross-sectional view of a sensing unit according to an embodiment of the inventive concept.
Figure 6B:
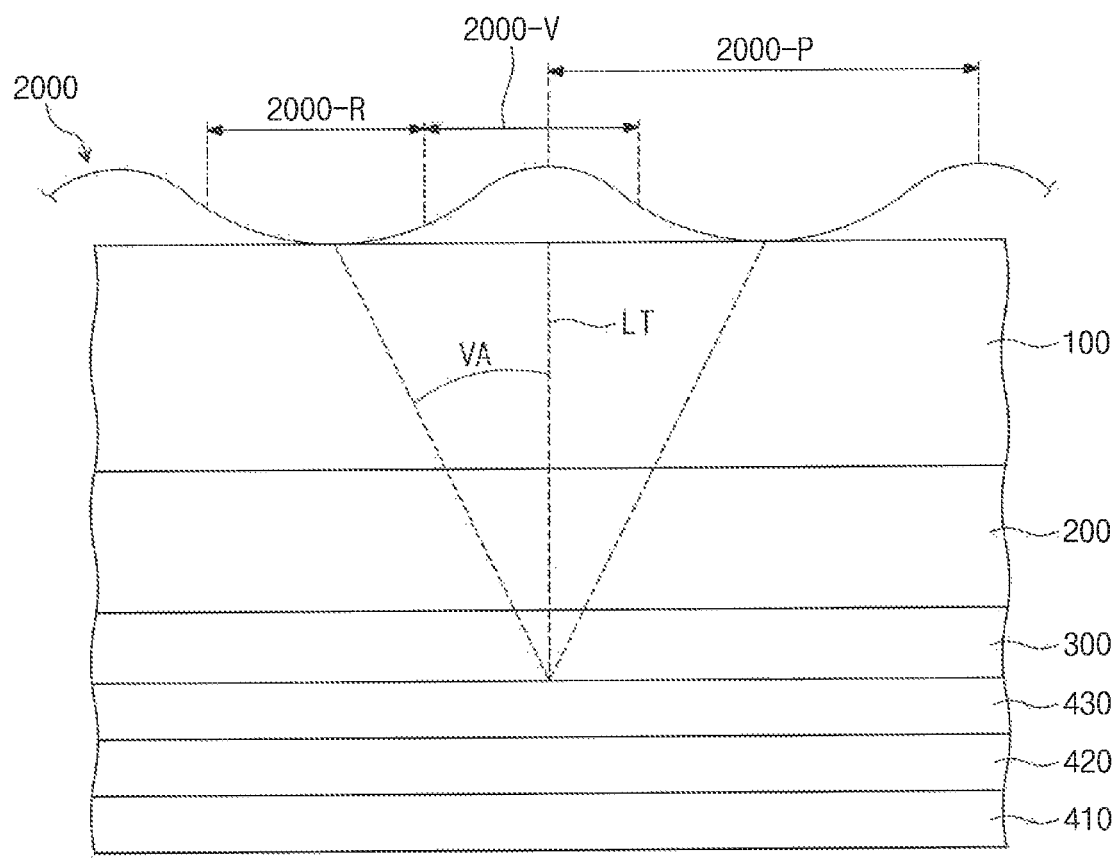
FIG. 6B is a schematic cross-sectional view of a display apparatus according to an embodiment of the inventive concept.

FIG. 6A is a cross-sectional view of a sensing unit according to an embodiment of the inventive concept. FIG. 6B is a schematic cross-sectional view of a display apparatus according to an embodiment of the inventive concept.

In FIG. 6B, a state in which the fingerprint 2000 is input to the display apparatus 1000 is illustrated. The display apparatus 1000 illustrated in FIG. 6B is a laminated structure of components of the display apparatus 1000 in FIG. 2 except for the housing 500.

Hereinafter, an embodiment of the inventive concept will be described with reference to FIGS. 6A and 6B.

Referring to FIG. 6A, the sensing unit 400 may include a base layer 410, a biometric information sensing layer 420 disposed on the base layer 410, and an optical pattern layer 430 disposed on the biometric information sensing layer 420. FIG. 6A illustrates a cross-sectional view corresponding to one effective sensing area 420-AAR. The effective sensing area 420-AAR may be an area defined in a sensing area 420-AR and in which one sensing device 420-PD and a transistor 420-T connected thereto are disposed.

The sensing area 420-AR may be a unit area having a rectangular shape, and a flat area of the sensing unit 400 may be divided into a plurality of sensing areas. The sensing area 420-AR may include one effective sensing area 420-AAR and a peripheral area of the effective sensing area 420-AAR.

A barrier layer 421 may be disposed on the base layer 410. A buffer layer 422 may be disposed on the barrier layer 421. Descriptions of the barrier layer 421 and the buffer layer 422 may correspond to those of the barrier layer 10 and the buffer layer 20 described previously with reference to FIG. 5.

The transistor 420-T may be disposed on the buffer layer 422. The transistor 420-T may include an active region (or channel) 420-A, a source 420-S, a drain 420-D, and a gate 420-G. The active region (or channel) 420-A, the source 420-S, and the drain 420-D may be disposed on the buffer layer 422.

A first insulation layer 423 may be disposed on the buffer layer 422 and may cover the active region (or channel) 420-A, the source 420-S, and the drain 420-D. The first insulation layer 423 may be an inorganic layer and/or an organic layer and may have a single-layer or multi-layer structure. In an embodiment, the first insulation layer 423 may be a single-layered silicon oxide layer.

The gate 420-G and a line layer 420-L may be disposed on the first insulation layer 423. A predetermined voltage, e.g., a bias voltage, may be supplied to the line layer 420-L. The line layer 420-L may be electrically connected to the sensing device 420-PD that will be described later.

A second insulation layer 424 may be disposed on the first insulation layer 423 and may cover the gate 420-G and the line layer 420-L. The second insulation layer 424 may be an inorganic layer and may have a single-layer or multi-layer structure. In an embodiment, the second insulation layer 424 may be a single-layered silicon oxide layer.

The sensing device 420-PD may be disposed on the second insulation layer 424. The sensing device 420-PD may be electrically connected to the transistor 420-T and the line layer 420-L. For example, the sensing device 420-PD may perform an operation that is controlled by a signal provided from the transistor 420-T and receive a predetermined voltage from the line layer 420-L. The sensing device 420-PD may be referred to as a sensor. The sensing device 420-PD (the sensor) may be included in the biometric information sensing layer 420.

The sensing device 420-PD may include a first sensing electrode 420-E1, a sensing layer 420-SA, and a second sensing electrode 420-E2.

The first electrode 420-E1 may pass through the first and second insulation layers 422 and 423 and may be electrically connected to the transistor 420-T. The first sensing electrode 420-E1 may include an opaque conductive material. For example, the first sensing electrode 420-E1 may include molybdenum (Mo).

The sensing layer 420-SA may be disposed on the first sensing electrode 420-E1. The sensing layer 420-SA may include amorphous silicon.

The second sensing electrode 420-E2 may be disposed on the sensing layer 420-SA. The second sensing electrode 420-E2 may include a transparent conductive material. For example, the second sensing electrode 420-E2 may include indium-tin oxide (ITO).

A third insulation layer 425 may be disposed on the second sensing electrode 420-E2. The third insulation layer 425 may be an inorganic layer and may have a single-layer or multi-layer structure. For example, the third insulation layer 425 may include a silicon oxide layer and a silicon nitride layer.

A connection electrode 420-C may be disposed on the third insulation layer 425. The connection electrode 420-C may pass through the third insulation layer 425 and may be electrically connected to the second sensing electrode 420-E2. The connection electrode 420-C may pass through the second and third insulation layers 424 and 425 and may be electrically connected to the line layer 420-L.

A fourth insulation layer 426 may be disposed on the third insulation layer 425 and may cover the connection electrode 420-C. The fourth insulation layer 426 may be an organic layer and may have a single-layer or multi-layer structure. For example, the fourth insulation layer 426 may be a single-layered polyimide-based resin layer.

The optical pattern layer 430 may be directly disposed on (e.g., may directly contact) the biometric information sensing layer 420. For example, the optical pattern layer 430 may be directly disposed on (e.g., may directly contact) the fourth insulation layer 426. That is, the optical pattern layer 430 and the biometric information sensing layer 420 may be provided through a continuous process.

The optical pattern layer 430 may include a light shielding part 431 and a transmission part 432. The light shielding part 431 may absorb light. The light shielding part 431 may include metal or an organic material having a high light absorption property. The light shielding part 431 may have a light transmittance of about 60% or less. For example, the light shielding part 431 may include molybdenum (Mo), titanium (Ti), aluminum (Al), chrome (Cr), an alloy, or a combination thereof. Alternatively, the light shielding part 431 may include a photosensitive material or an organic material such as carbon. The transmission part 432 may be optically clear. The transmission part 432 may include a material having a light transmittance of about 90% or more. For example, the transmission part 432 may include polyimide. Thus, the transmission part 432 may have a light transmittance greater than the light transmittance of the light shielding part 431.

The light shielding part 431 may have a predetermined height 431H in the third direction DR3. The light shielding part 431 may include a plurality of light shielding layers 4311, 4312, and 4313 spaced apart from each other in the third direction DR3 within a range of the height 431H. The light shielding layers 4311, 4312, and 4313 may include a first light shielding layer 4311, a second light shielding layer 4312, and a third light shielding layer 4313.

In an embodiment, since the light shielding part 431 may be disposed on the biometric information sensing layer 420, and the display module 300 may be disposed on the sensing unit 400, the light shielding part 431 may be disposed between the biometric information sensing layer 420 and the display module 300.

In an embodiment, a spaced distance 431-H between adjacent layers of the first to third light shielding layers 4311, 4312, and 4313 in the third direction DR3 may be uniform. However, this is merely illustrative. For example, in an embodiment, the light shielding layers 4311, 4312, and 4313 may be spaced at different distances from each other, and the light shielding part 431 may include four or more light shielding layers. However, embodiments of the inventive concept are not limited thereto.

Each of the light shielding layers 4311, 4312, and 4313 may have a thickness capable of having a light transmittance of about 60% or less. As each of the light shielding layers 4311, 4312, and 4313 is made of a material having a relatively high transmittance but has a sufficient thickness capable of having a low light transmittance, light incident to the biometric information sensing layer 420 may be filtered with a predetermined range.

A plurality of holes H1, H2, and H3 spaced apart from each other on the plane may be defined in each of the light shielding layers 4311, 4312, and 4313. For example, a plurality of first holes H1 spaced apart from each other and passing through the first light shielding layer 4311 may be defined in the first light shielding layer 4311, a plurality of second holes H2 may be defined in the second light shielding layer 4312, and a plurality of third holes H3 may be defined in the third light shielding layer 4313.

In an embodiment, the first to third holes H1, H2, and H3 may be defined at coincided positions in the third direction DR3. For example, corresponding first holes H1, second holes H2, and third holes H3 may be aligned with each other in the third direction DR3 (e.g., the thickness direction of the light shielding part 431). The first to third holes H1, H2, and H3 may have the same shape as each other on a plane defined by the first direction DR1 and the second direction DR2.

For example, each of the first to third holes H1, H2, and H3 may have a circular shape on the plane and a diameter corresponding to a width 431-W (hereinafter, referred to as a hole width) defined in the first direction DR1. Each of the first to third holes H1, H2, and H3 may be spaced a predetermine pitch 431-P (hereinafter, referred to as a hole pitch) from each other on the plane. However, this is merely illustrative, and the first to third holes H1, H2, and H3 may have shapes different from each other or various shapes such as, for example, a circle, an oval, or a polygon. However, embodiments of the inventive concept are not limited thereto.

The transmission part 432 fills the holes H1, H2, and H3 and fills portions between the light shielding layers 4311, 4312, and 4313. For example, as shown in FIG. 6A, the transmission part 432 may fill the holes H1 between adjacent parts of the first light shielding layer 4311 in the first direction DR1, the holes H2 between adjacent parts of the second light shielding layer 4312 in the first direction DR1, and the holes H3 between adjacent parts of the third light shielding layer 4313 in the first direction DR1. In addition, the transmission part 432 may fill the portions between adjacent parts of the first light shielding layer 4311, the second light shielding layer 4312, and the third light shielding layer 4313 in the third direction DR3. The transmission part 432 may be provided in an integrated state. In the embodiment, a portion of the transmission part 432 may cover the light shielding part 431. Thus, the optical pattern layer 430 may have a thickness about equal to or greater than the height 431H of the light shielding part. However, this is merely illustrative, and in an embodiment, a top surface of the light shielding part 431 may be exposed through the transmission part 432. Here, the height 431H of the light shielding part may correspond to the thickness of the optical pattern layer 430.

Light 2000-L reflected from the fingerprint 2000 may pass through the transmission part 432, particularly the transmission part 432 filled in the holes H1, H2, and H3, and be incident to the sensing device 420-PD. In an embodiment, the transmission part 432 filled in the holes H1, H2, and H3 may substantially correspond to a transmission window of the optical pattern layer 430.

Referring to FIG. 6B, the fingerprint 2000 includes a plurality of ridges 2000-R and a plurality of valleys 2000-V. The sensing unit 400 may recognize the fingerprint by receiving light reflected from the valleys 2000-V. A predetermined viewing angle VA may be defined in the sensing unit 400. The viewing angle VA may be designed to receive only light reflected from one valley 2000-V. Thus, the viewing angle VA may have a maximum value that is an angle at which light reflected from vertices of two ridges 2000-R disposed adjacent to each other with one valley 2000-V therebetween is incident.

Referring to FIGS. 6A and 6B, in an embodiment, the optical pattern layer 430 filters only light within a maximum incident angle 2000-AG of the light incident to the optical pattern layer 430 and provides the filtered light to the biometric information sensing layer 420. The maximum incident angle 2000-AG may be an angle at which a ratio of side luminance to front luminance is about 25% or less. Here, the maximum incident angle 2000-AG may be designed in correspondence to the viewing angle VA. When the incident angle 2000-AG is greater than the viewing angle VA, not only light reflected from the valley of the fingerprint 2000 corresponding to the sensing device 420-PD, but also light reflected from another valley adjacent to and above the valley may be incident to the sensing device 420-PD. This may reduce the fingerprint recognition accuracy. According to an embodiment of the inventive concept, the incident angle 2000-AG of light capable of being transmitted through the optical pattern layer 430 may be restricted by the optical pattern layer 430. For example, only light incident at an angle about equal to or less than the predetermined incident angle 2000-AG may be incident to the sensing device 420-PD by the optical pattern layer 430. Thus, the fingerprint recognition accuracy or fingerprint recognition sensitivity may be increased.

Since the maximum incident angle 2000-AG corresponds to the viewing angle VA, the maximum incident angle 2000-AG may be determined in consideration of a half value of the pitch 2000-P of the fingerprint 2000 and a spaced distance LT between the optical pattern layer 430 and an outermost surface of the display apparatus 1000. For example, the pitch of the fingerprint 2000 may be defined as a gap between valleys 2000-V or a gap between ridges 2000-R. The pitch 2000-P of the fingerprint 2000 may have a range from about 400 μm to about 600 μm. In an embodiment, the spaced distance LT may be a distance between a top surface of the optical pattern layer 430 and a top surface of the window 100.

For example, when the pitch 2000-P of the fingerprint 2000 is about 400 μm, and the spaced distance LT is about 1200 μm, the maximum incident angle 2000-AG may be defined as tan−1(200/1200) that is about 10°. Also, when the pitch 2000-P of the fingerprint 2000 is about 600 μm, and the spaced distance LT is about 800 μm, the maximum incident angle 2000-AG may be defined as tan−1(300/800) that is about 20°. A predetermined angle may be set as a design condition in consideration of the pitch 2000-P of the fingerprint 2000 and the spaced distance LT.

Referring to FIG. 6A, the incident angle 2000-AG may be controlled by a ratio between the hole width 431-W and the height 431H of the light shielding part 431. The hole width 431-W may be defined as a width of the transmission window. As the transmission part 432 is filled in the holes H1, H2, and H3, the holes H1, H2, and H3 may serve as the transmission window through which incident light is transmitted. According to an embodiment, the ratio between the hole width 431-W and the height 431H of the light shielding part 431 may be set to satisfy the mathematical equation below so that the maximum incident angle 2000-AG of light transmitted through the optical pattern layer 430 is about 13° or less.

Hole width(431-W)/Height(431H) of light shielding part≤Tan(13°)     [Mathematical equation]

In an embodiment, the ratio of the hole width 431-W to the height 431H of the light shielding part may be about 0.2311 or less. For example, the height 431H of the light shielding part may be about equal to or greater than about 1/tan(AG) times of the hole width 431-W. The AG may be an angle set according to design conditions. When the height 431H of the light shielding part is about 1/tan(AG) times of the hole width 431-W, the angle may correspond to the maximum incident angle 2000-AG of the light capable of being transmitted through the optical pattern layer 430.

The hole width 431-W, the height 431H of the light shielding part, and the hole pitch 431-P may be designed in consideration of the above mathematical equation. Also, the hole width 431-W, the height 431H of the light shielding part, and the hole pitch 431-P may have a complementary relationship.

For example, as the hole width 431-W decreases, the number of holes defined in the same effective sensing area 420-AAR may increase, and thus, sensitivity of one sensing device 420-PD may increase. However, as the hole width 431-W decreases, process costs may increase, and process reliability may be degraded. On the contrary, although a process may be efficiently performed as the hole width 431-W increases, the height 431H of the light shielding part for satisfying the maximum incident angle 2000-AG may increase.

Since the hole width 431-W for satisfying the maximum incident angle decreases as the height 431H of the light shielding part decreases, a difficulty level of the process may increase. On the contrary, since the thickness of the optical pattern layer 430 increases as the height 431H of the light shielding part increases, a loss amount of light arriving at the biometric information sensing layer 420 may increase.

Since the number of the holes defined in the effective sensing area 420-AAR decreases as the hole pitch 431-P increases, a light transmittance of the optical pattern layer 430 may decrease. On the contrary, as the hole pitch 431-P decreases, the process reliability may decrease.

According to an embodiment, the maximum incident angle 2000-AG may be designed to be about equal to or less than about 13° under a condition in which the hole width 431-W is about 1.5 μm or more, the hole pitch 431-P is about 3 μm or more, and the height 431H of the light shielding layer is about 15 μm or less. According to an embodiment of the inventive concept, as the plurality of holes H1, H2, and H3 is defined in the light shielding layers 4311, 4312, and 4313, and the transmission part 432 is filled therein, the small hole width 431-W may be designed. As the small hole width 431-W is defined, the height 431H of the light shielding layer may decrease. Thus, the thickness of the optical pattern layer 430 may decrease, and the sensitivity of the sensing unit 400 may be increased. A detailed description thereof will be described later.

Figure 7:
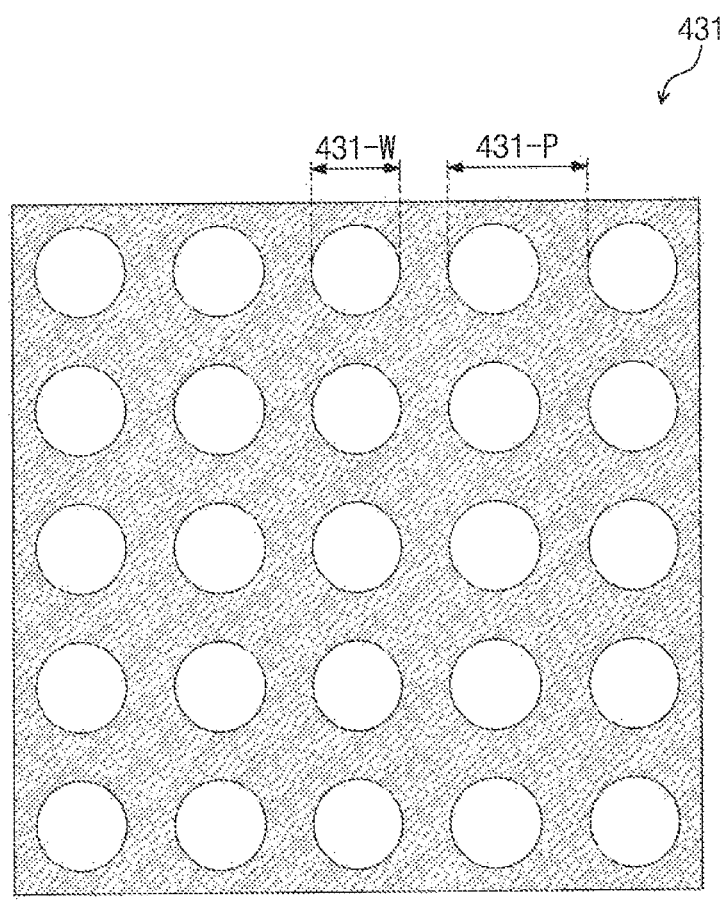
FIG. 7 is a plan view of a light shielding part according to an embodiment of the inventive concept.
Figure 8:
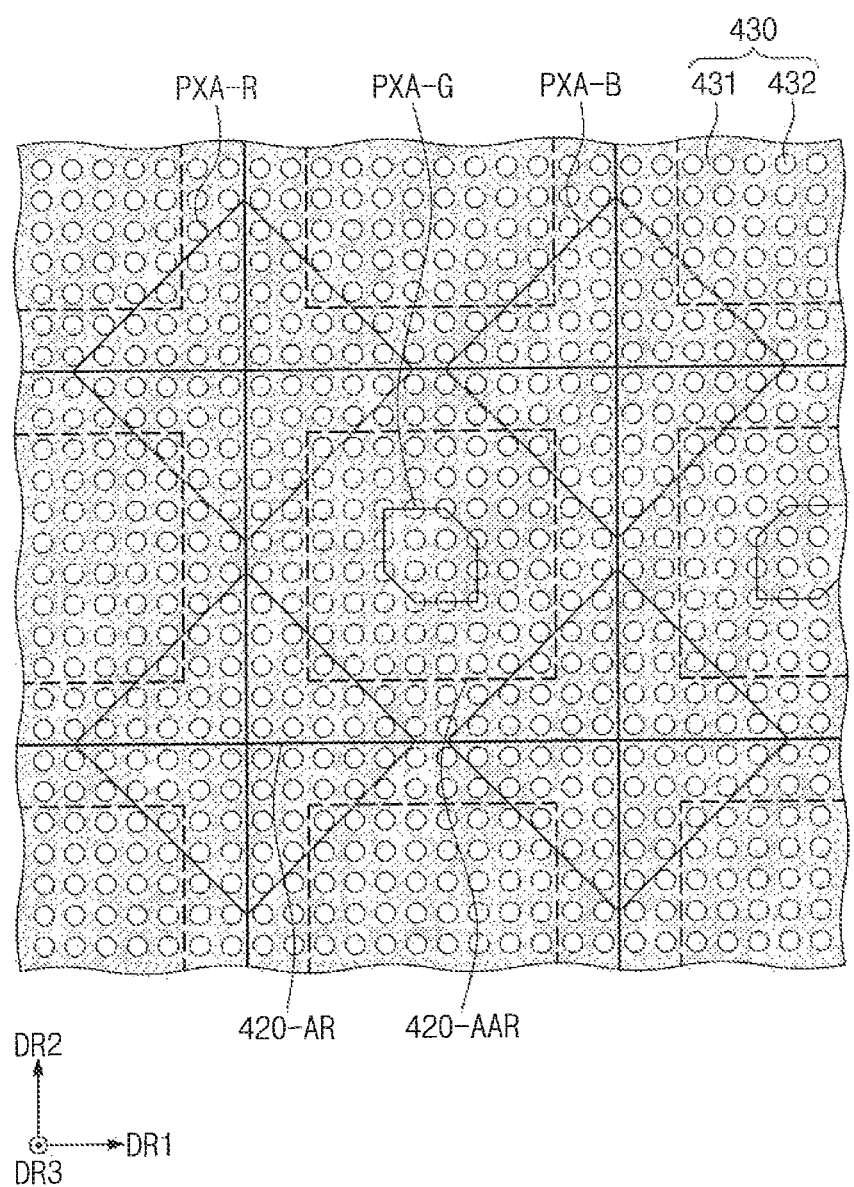
FIG. 8 is a plan view illustrating a relationship between partial components of a display apparatus according to an embodiment of the inventive concept.

FIG. 7 is a plan view of a light shielding part according to an embodiment of the inventive concept. FIG. 8 is a plan view illustrating a relationship between partial components of a display apparatus according to an embodiment of the inventive concept.

In FIG. 8, light emitting areas PXA-R, PXA-G, and PXA-B, an optical pattern layer 430, and a sensing area 420-AR are illustrated. Also, in FIG. 8, the optical pattern layer 430 is illustrated as including a light shielding part 431 and a transmission part 432 that fills in holes for convenience of description. Thus, the transmission part 432 that fills in the holes may substantially correspond to the holes H1, H2, and H3 (refer to FIG. 6A).

Hereinafter, an embodiment of the inventive concept will be described with reference to FIGS. 7 and 8. A plurality of holes is defined in the light shielding part 431. A top surface of the light shielding part 431 in FIG. 7 may substantially correspond to a top surface of the first light shielding layer 4311 (refer to FIG. 6A).

When viewed on a plane, each of the holes may have a circular shape. A hole width 431-W may correspond to a diameter of the circle. However, embodiments of the inventive concept are not limited thereto. For example, in embodiments, the hole may have various shapes such as an oval shape or a polygonal shape.

The holes may be arranged in the first direction DR1 and the second direction DR2. For example, the transmission part 432 may be arranged in a matrix form. In an embodiment, a hole pitch 431-P may be defined in the first direction DR1. Although the hole pitch 431-P may be different in the first direction DR1 and the second direction DR2, embodiments of the inventive concept are not limited thereto.

Each of the light emitting areas PXA-R, PXA-G, and PXA-B may correspond to the light emitting area PXA in FIG. 5. For example, the light emitting areas PXA-R, PXA-G, and PXA-B may include a first light emitting area PXA-R, a second light emitting area PXA-G, and a third light emitting area PXA-B. The first light emitting area PXA-R may provide red light, the second light emitting area PXA-G may provide green light, and the third light emitting area PXA-B may provide blue light.

The second light emitting area PXA-G may have a surface area less than that of each of the first light emitting area PXA-R and the third light emitting area PXA-B. The third light emitting area PXA-B may have a surface area that is greater than that of each of the first light emitting area PXA-R and the second light emitting area PXA-G.

In an embodiment of the inventive concept, one sensing area 420-AR may overlap a plurality of light emitting areas. For example, one sensing area 420-AR may overlap partial areas of two first light emitting areas PXA-R, one second light emitting area PXA-G, and partial areas of two third light emitting areas PXA-B.

In an embodiment of the inventive concept, each of the first to third light emitting areas PXA-R, PXA-G, and PXA-B may overlap the transmission part 432 that fills the plurality of holes. That is, each of first electrodes 313E-1 (refer to FIG. 5) disposed on the first to third light emitting areas PXA-R, PXA-G, and PXA-B may also overlap the transmission part 432 that fills the plurality of holes.

The number of the transmission parts 432 overlapping each of the first to third light emitting areas PXA-R, PXA-G, and PXA-B may be different according to the surface area of each of the first to third light emitting areas PXA-R, PXA-G, and PXA-B. For example, the number of the transmission parts 432 that fills the plurality of holes overlapping the third light emitting area PXA-B may be the largest, the number of the transmission parts 432 that fills the plurality of holes overlapping the first light emitting area PXA-R may be the second largest, and the number of the transmission parts 432 that fills the plurality of holes overlapping the second light emitting area PXA-G may be the least. Each of the first to third light emitting areas PXA-R, PXA-G, and PXA-B may have a surface area less than that of the sensing area 420-AR. Thus, the number of holes overlapping each of the first to third light emitting areas PXA-R, PXA-G, and PXA-B may be less than the number of holes overlapping the sensing area 420-AR. Also, the number of holes overlapping the first electrode 313-E1 (refer to FIG. 5) may be less than the number of holes overlapping the second sensing electrode 420-E2 (refer to FIG. 6). However, this is merely illustrative. Although the surface area of each of the first to third light emitting areas PXA-R, PXA-G, and PXA-B may be variously designed, embodiments of the inventive concept are not limited thereto.

Figure 9A:
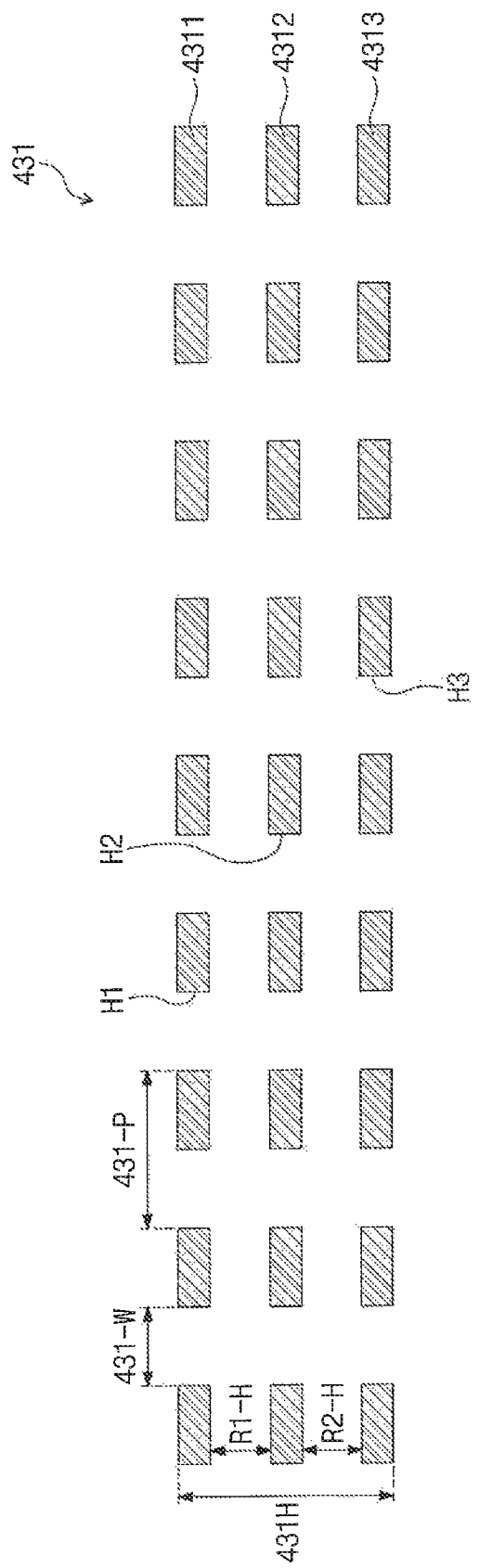
FIGS. 9A to 9C are cross-sectional views of light shielding parts according to embodiments of the inventive concept.
Figure 9B:
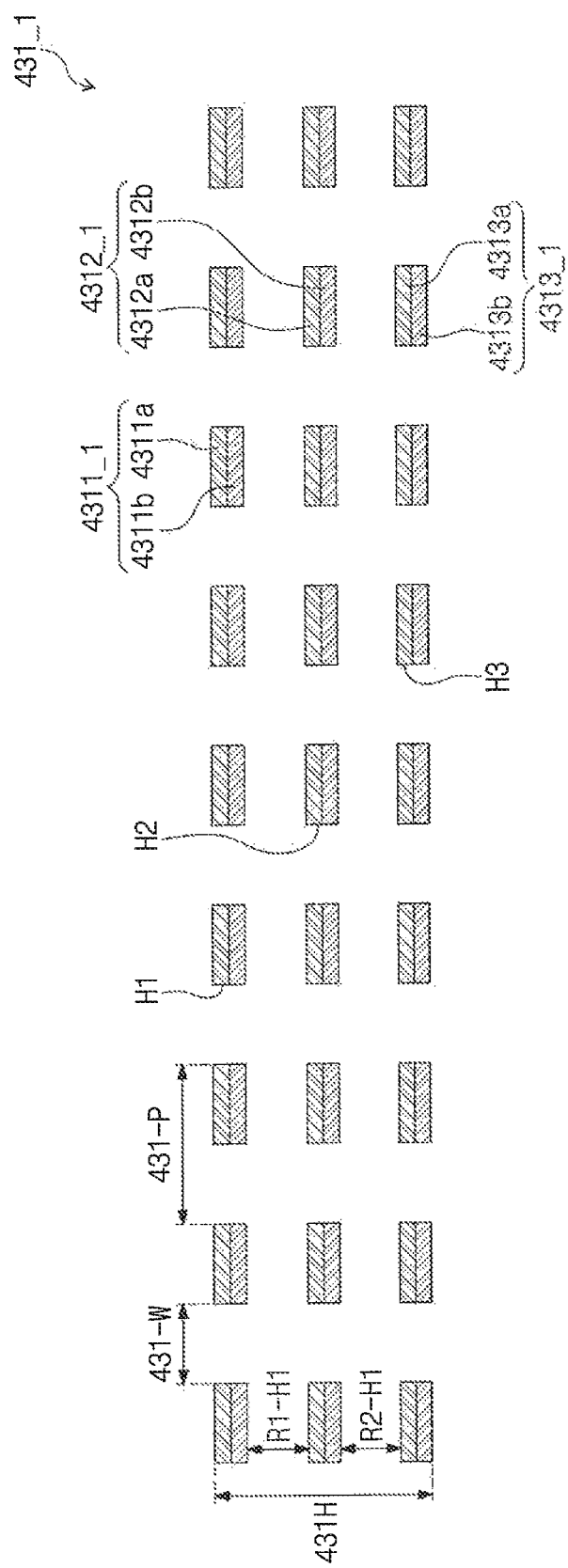
Figure 9C:
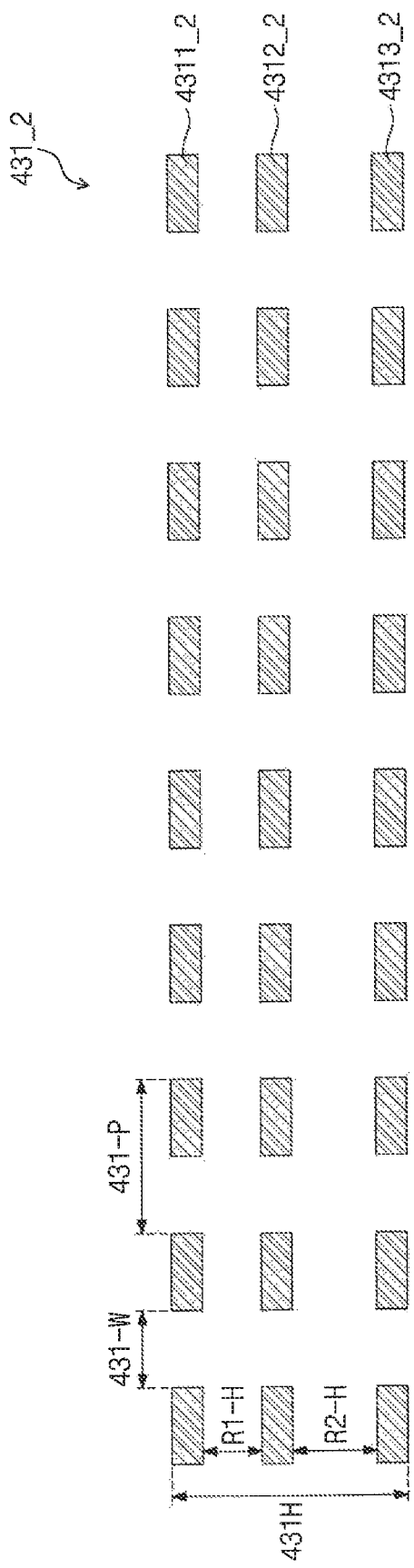

FIGS. 9A to 9C are cross-sectional views of a light shielding layer according to embodiments of the inventive concept. In FIGS. 9A to 9C, light shielding parts including three light shielding layers are exemplarily illustrated.

Hereinafter, embodiments of the inventive concept will be described with reference to FIGS. 9A to 9C.

In FIG. 9A, a light shielding part 431 corresponding to the light shielding part 431 in FIG. 6A is illustrated. For example, a plurality of first holes H1 may be defined in a first light shielding layer 4311. The first holes H1 are arranged with a predetermined pitch 431-P, and each of the first holes H1 may have a predetermined width 431-W.

A plurality of second holes H2 may be defined in a second light shielding layer 4312. Each of the second holes H2 may have a pitch and a width corresponding to the hole pitch 431-P and the hole width 431-W defined in the first light shielding layer 4311. Similarly, a plurality of third holes H3 may be defined in a third light shielding layer 4313. Each of the second holes H2 may have a pitch and a width corresponding to the hole pitch 431-P and the hole width 431-W defined in the first light shielding layer 4311.

A gap R1-H between the first light shielding layer 4311 and the second light shielding layer 4312 may be about the same as a gap R2-H between the second light shielding layer 4312 and the third light shielding layer 4313. According to an embodiment of the inventive concept, as the light shielding part 431 includes the plurality of same light shielding layers, a process thereof may be simplified.

The first to third light shielding layers 4311, 4312, and 4313 may be made of the same material or different materials from each other. For example, all of the first to third light shielding layers 4311, 4312, and 4313 may be made of metal or organic layers. Alternatively, a portion of the first to third light shielding layers 4311, 4312, and 4313 may be made of metal, and the rest may be made of an organic layer. Alternatively, a portion of the first to third light shielding layers 4311, 4312, and 4313 may be made of a first metal, and the rest may be made of a second metal. In an embodiment, the first to third light shielding layers 4311, 4312, and 4313 may be made of materials different from each other. The light shielding part 431 according to an embodiment of the inventive concept may be made of various combinations. However, embodiments of the inventive concept are not limited thereto.

As shown in FIG. 9A, in an embodiment, the first to third holes H1, H2, and H3 may have the same width and the same shape as each other on a plane.

As illustrated in FIG. 9B, in an embodiment, each of first to third light shielding layers 4311_1, 4312_1, and 4313_1 constituting a light shielding part 431_1 may have a multilayer structure. For example, the first light shielding layer 4311_1 may include a first layer 4311a and a second layer 4311b, which are laminated with each other. The first layer 4311a and the second layer 4311b may be made of different materials from each other. For example, the first layer 4311a and the second layer 4311b may be made of different metals from each other. Alternatively, one of the first layer 4311a and the second layer 4311b may be made of an insulating material, and the other may be made of a metal.

The first light shielding layer 4311_1 and the second light shielding layer 4312_1 are spaced apart from each other by a gap R1-H1, and the second light shielding layer 4312_1 and the third light shielding layer 4313_1 are spaced apart from each other by a gap R2-H1. In FIG. 9B, the gaps R1-H1 and R2-H2 are illustrated as being about the same each other. However, embodiments of the inventive concept are not limited thereto.

Each of the second light shielding layer 4312_1 and the third light shielding layer 4313_1 may have the same structure as the first light shielding layer 4311_1. For example, the second light shielding layer 4312_1 may include a first layer 4312*a* and a second layer 4312*b*, which are laminated with each other, and the third light shielding layer 4313_1 may include a first layer 4313*a* and a second layer 4313*b*, which are laminated with each other. However, this is merely illustrative. For example, in embodiments, each of the second light shielding layer 4312_1 and the third light shielding layer 4313_1 may have a different structure from the first light shielding layer 4311_1.

For example, one of the first to third light shielding layers 4311_1, 4312_1, and 4313_1 may have a multi-layer structure, and the rest of the light shielding layers may have a single-layer structure. Alternatively, one of the first to third light shielding layers 4311_1, 4312_1, and 4313_1 may have a multi-layer structure, and the rest of the light shielding layers may have a single-layer structure. However, this is merely illustrative, and the light shielding part 431_1 is not limited to the various combinations described herein.

As illustrated in FIG. 9C, in an embodiment, a light shielding part 431_2 may include first to third light shielding layers 4311_2, 4312_2, and 4313_2 spaced apart and having different gaps from each other. For example, a gap R1-H (hereinafter referred to as a first gap) between the first light shielding layer 4311_2 and the second light shielding layer 4312_2 may be smaller than a gap R2-H (hereinafter referred to as a second gap) between the second light shielding layer 4312_2 and the third light shielding layer 4313_2. According to an embodiment of the inventive concept, the light shielding part may be designed to have various structures within a height 431H of the light shielding layer by independently controlling the first gap R1_H and the second gap R2_H.

In an embodiment according to FIG. 9C, each of the layers 4311_2, 4312_2, and 4313_2 is designed to have the same hole pitch 431-P. However, this is merely illustrative. For example, although each of the layers 4311_2, 4312_2, and 4313_2 is designed to have different hole pitches 431-P in an embodiment, embodiments of the inventive concept are not limited thereto.

Figure 10A:
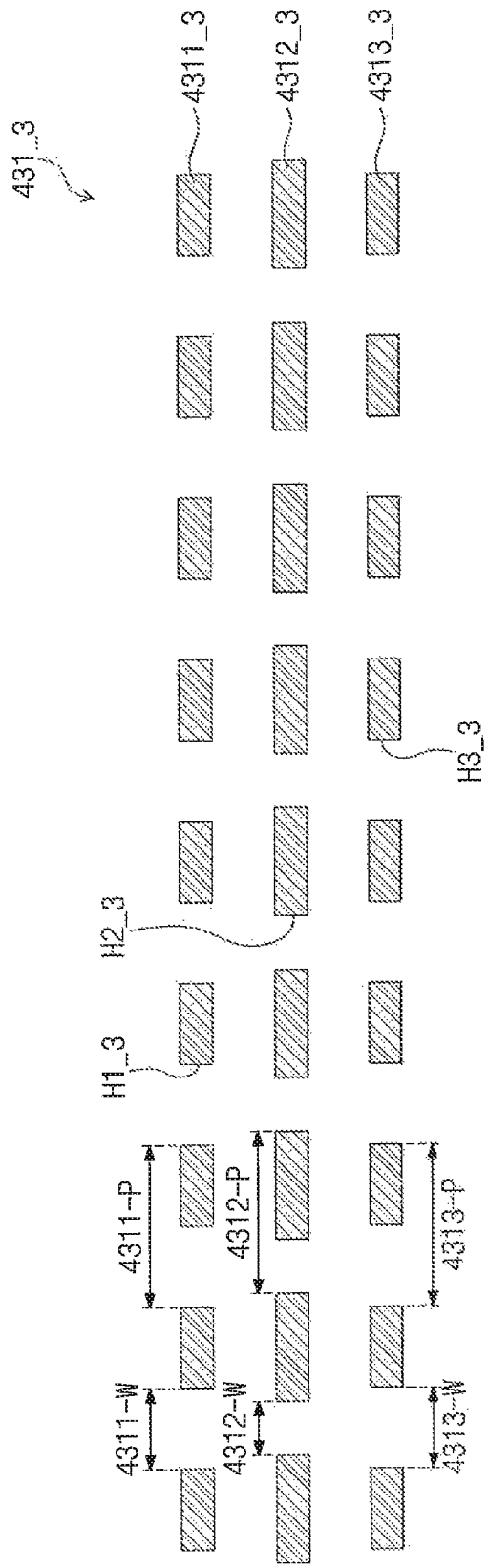
FIGS. 10A and 10B are cross-sectional views of light shielding parts according to embodiments of the inventive concept.
Figure 10B:
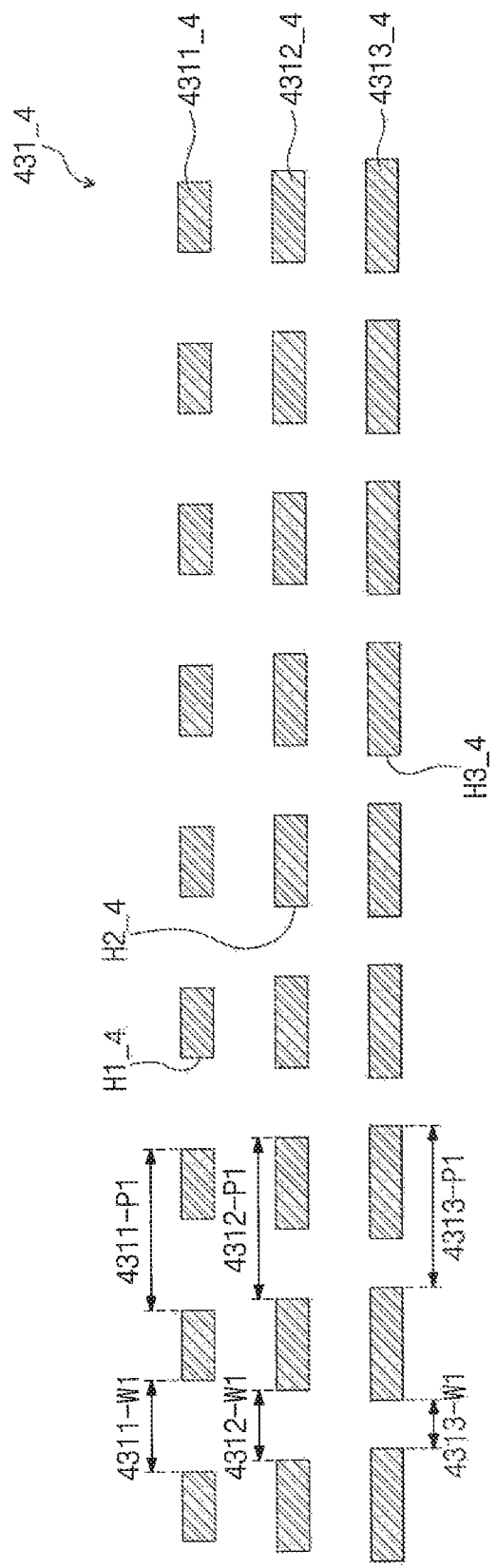
Figure 10C:
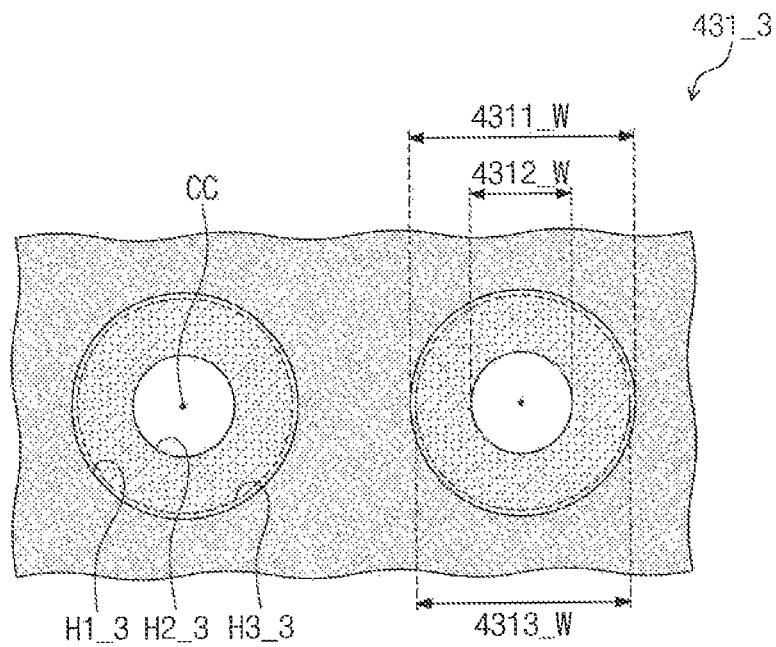
FIGS. 10C and 10D are partial plan views of light shielding parts according to embodiments of the inventive concept.
Figure 10D:
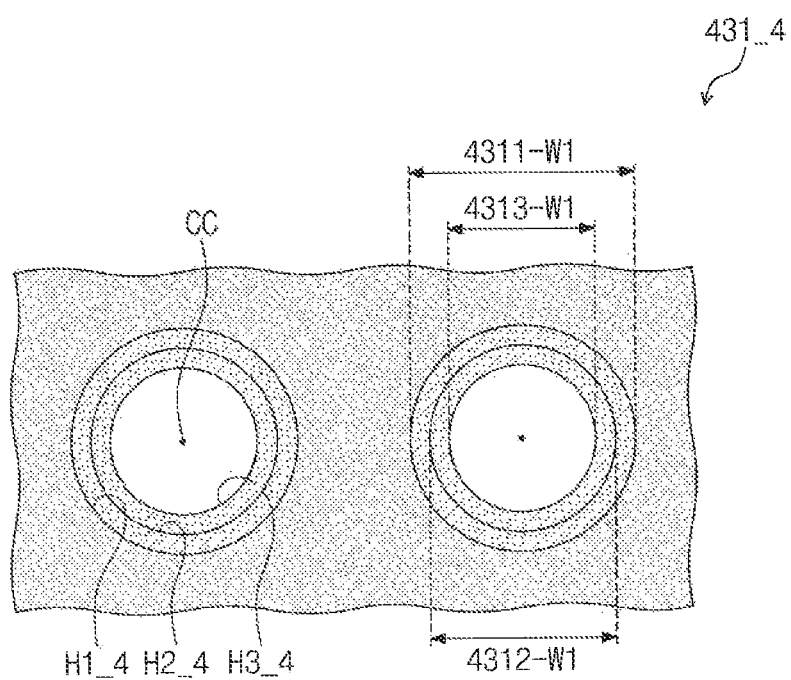

FIGS. 10A and 10B are cross-sectional views of light shielding parts according to embodiments of the inventive concept. FIGS. 10C and 10D are partial plan views of the light shielding parts according to embodiments of the inventive concept. For example, FIG. 10C illustrates a partial area of a light shielding part 431_3 in FIG. 10A, and FIG. 10D illustrates a partial area of a light shielding part 431_4 in FIG. 10B.

Hereinafter, an embodiment of the inventive concept will be described with reference to FIGS. 10A to 10D. For convenience of explanation, a further description of components and technical aspects previously described will be omitted.

As illustrated in FIGS. 10A and 10C, in an embodiment, the light shielding part 431_3 includes first to third light shielding layers 4311_3, 4312_3, and 4313_3. Here, first to third holes H1_3, H2_3, and H3_3 may be differently designed from first to third holes H1, H2, and H3 previously described.

For example, the first holes H1_3 defined in the first light shielding layer 4311_3 may be arranged with a first pitch 4311-P, and each of the first holes H1_3 may have a first width 4311-W. The second holes H2_3 defined in the second light shielding layer 4312_3 may be arranged with a second pitch 4312-P, and each of the second holes H2_3 may have a second width 4312-W. The third holes H3_3 defined in the third light shielding layer 4313_3 may be arranged with a third pitch 4313-P, and each of the third holes H3_3 may have a third width 4313-W.

The first to third widths 4311-W, 4312-W, and 4313-W may be different from each other. For example, the first width 4311-W may be greater than the second width 4312-W and about equal to the third width 4313-W. Centers CC of the first to third holes H1_3, H2_3, and H3_3 may be aligned to coincide with each other in a thickness direction. The first to third pitches 4311-P, 4312-P, and 4313-P may be about equal to each other.

Alternatively, in an embodiment, as illustrated in FIGS. 10B and 10D, a light shielding part 431_4 may include first to third light shielding layers 4311_4, 4312_4, and 4313_4, and first to third holes H1_4, H2_4, and H3_4 may have widths that gradually decrease in order.

For example, the first holes H1_4 defined in the first light shielding layer 4311_4 disposed at an uppermost layer of the light shielding part 431_4 may have a first hole width 4311-W1 greater than each of a second hole width 4312-W1 and a third hole width 4313-W1, and the third holes H3_4 defined in the third light shielding layer 4313_4 disposed at a lowermost layer of the light shielding part 431_4 may have the third hole width 4313-W1 less than each of the first hole width 4311-W1 and the second hole width 4312-W1.

Although first to third pitches 4311-P1, 4312-P1, and 4313-P1 are illustrated as being about the same as each other, this is merely illustrative, and embodiments of the inventive concept are not limited thereto. For example, the first to third pitches 4311-P1, 4312-P1, and 4313-P1 may have different values from each other according to embodiments of the inventive concept.

According to an embodiment of the inventive concept, the first to third light shielding layers 4311_3, 4311_4, 4312_3, 4312_4, 4313_3, and 4313_4 may be independent from each other. Also, the first to third holes H1_3, H1_4, H2_3, H2_4, H3_3, and H3_4 may be independent from each other. Thus, as the first to third widths 4311_W, 4311-W1, 4312-W, 4312-W1, 4313-W, and 4313-W1 or the first to third pitches 4311-P, 4311-P1, 4312-P, 4312-P1, 4313-P, and 4313-P1 have various values, a degree of freedom in design of the light shielding parts 431_3 and 431_4 may increase.

The light shielding part according to an embodiment of the inventive concept may be provided by combinations of the light shielding layers in FIGS. 9A to 10D. According to an embodiment of the inventive concept, the light shielding layers having various shapes may be designed when the maximum incident angle of the incident light is set to be about 13° or less. However, embodiments of the inventive concept are not limited thereto.

FIGS. 11A to 11F are cross-sectional views illustrating a method of forming a sensing unit according to an embodiment of the inventive concept.

Hereinafter, an embodiment of the inventive concept will be described with reference to FIGS. 11A to 11F.

Figure 11A:
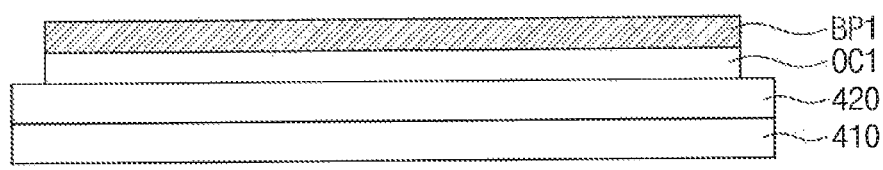
FIGS. 11A to 11F are cross-sectional views illustrating a method of forming a sensing unit according to an embodiment of the inventive concept.

As illustrated in FIG. 11A, in an embodiment, a first transmission layer OC1 and a first initial light shielding layer BP1 may be sequentially formed on a top surface of a biometric information sensing layer 420, which is formed on a base layer 410. The first transmission layer OC1 may be formed by depositing, applying, or printing an insulating material having a high optical transmittance on the biometric information sensing layer 420. For example, the first transmission layer OC1 may be formed by applying a polyimide solution on the top surface of the biometric information sensing layer 420 and then curing the applied polyimide solution.

The first initial light shielding layer BP1 may be formed by depositing, printing, or applying a material having a high light absorption property on the first transmission layer OC1. For example, the first initial light shielding layer BP1 may be formed by depositing a metal or an inorganic insulating material or printing/applying a chrome-based organic material on a top surface of the first transmission layer OC1. However, this is merely illustrative. For example, in an embodiment, the first transmission layer OC1 may be formed on a separate carrier substrate. Thereafter, a process of removing the carrier substrate and attaching the biometric information sensing layer 420 may be further performed.

Figure 11B:
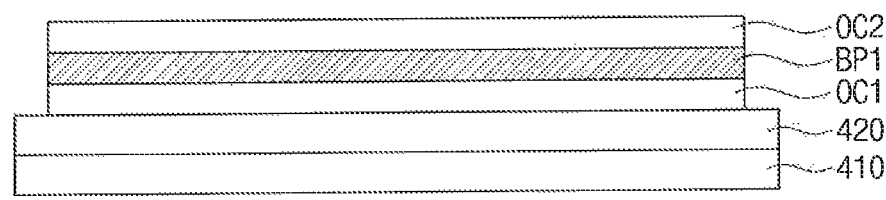
Figure 11C:
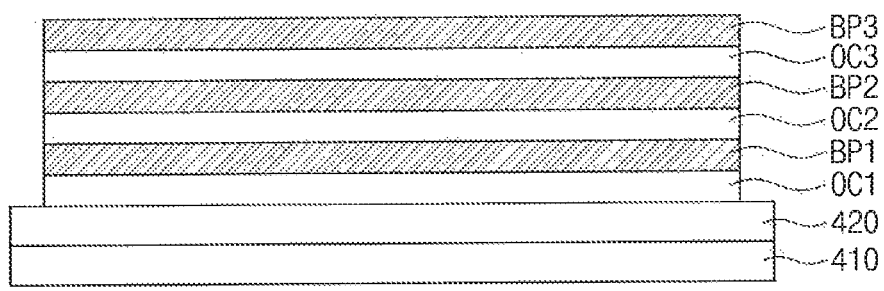

Thereafter, as illustrated in FIGS. 11B and 11C, a second transmission layer OC2, a second initial light shielding layer BP2, a third transmission layer OC3, and a third initial light shielding layer BP3 are sequentially laminated. Gaps between the first to third initial light shielding layers BP1, BP2, and BP3 may be controlled by thicknesses of the second transmission layer OC2 and the third transmission layer OC3.

Figure 11D:
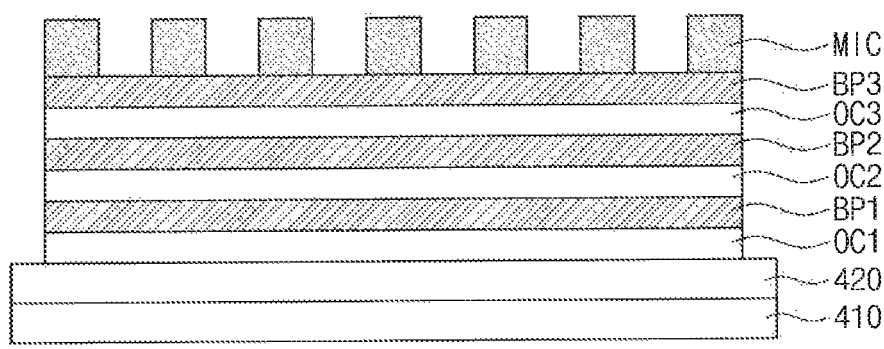

Thereafter, as illustrated in FIG. 11D, a mask MIC is formed on the third initial light shielding layer BP3. The mask MIC may be formed by defining a plurality of holes HH (see FIG. 11E) in a layer covering a front surface of the third initial light shielding layer BP3.

Figure 11E:
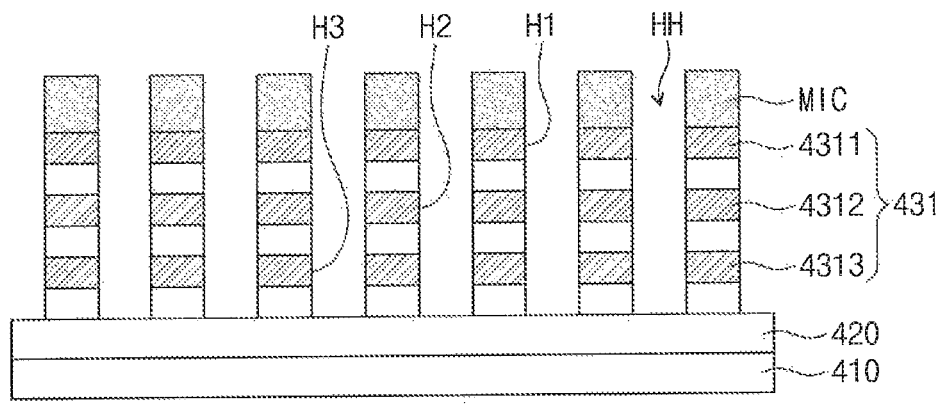

Thereafter, as illustrated in FIG. 11E, the first to third initial light shielding layers BP1, BP2, and BP3 are patterned to define a plurality of holes H1, H2, and H3 in each of the first to third initial light shielding layers BP1, BP2, and BP3. The holes H1, H2, and H3 may be defined in an area exposed by the holes HH of the mask MIC.

The patterning of the first to third initial light shielding layers BP1, BP2, and BP3 may be performed by an etching process. In an embodiment, the patterning of the first to third initial light shielding layers BP1, BP2, and BP3 may be performed by a dry etching process. As the first to third initial light shielding layers BP1, BP2, and BP3 are patterned, the light shielding part 431 in which the first to third holes H1, H2, and H3 are defined may be formed.

The first to third transmission layers OC1, OC2, and OC3 may be also patterned. In an embodiment, the first to third initial light shielding layers BP1, BP2, and BP3 may be made of materials that are etched by the same etching gas as the first to third transmission layers OC1, OC2, and OC3. In this case, since the first to third holes H1, H2, and H3 may be formed at once through a single etching process, a process may be simplified, and process costs may be reduced. However, this is merely illustrative, and embodiments of the inventive concept are not limited thereto. For example, in an embodiment, the first to third transmission layers OC1, OC2, and OC3 or the first to third initial light shielding layers BP1, BP2, and BP3 may be etched by different etching gases from each other or patterned through different masks from each other.

Figure 11F:
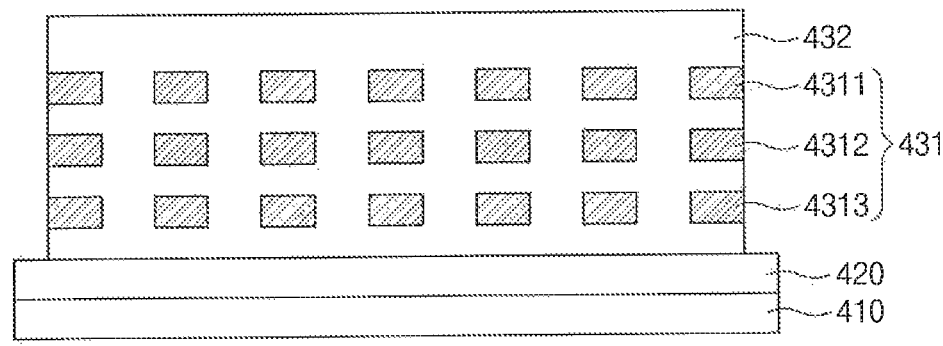

Thereafter, as illustrated in FIG. 11F, the mask MIC is removed, and then a transmission part 432 is formed. The transmission part 432 may be formed by providing a light transmission material on a top surface of the light shielding part 431. The light transmission material fills the holes H1, H2, and H3 and covers the top surface of the light shielding part 431. The transmission part 432 may be made of the same material as the first to third transmission layers OC1, OC2, and OC3. Thus, the transmission part 432 may be formed in an integrated manner.

Thereafter, a polishing process may be further performed. The polishing process may flatten a top surface of the transmission part 432. Alternatively, the polishing process may remove the transmission part 432 covering the top surface of the light shielding part 431 to expose the top surface of the light shielding part 431.

According to an embodiment of the inventive concept, an optical pattern layer may be formed through a process of forming the transmission part by forming the holes in the light shielding part 431 and then filling the holes. When a dry etching process is used, micro-sized holes may be efficiently formed. Thus, since widths of the holes H1, H2, and H3 may be precisely controlled, an optical pattern layer 430 having a reduced thickness and an increased light transmittance may be efficiently formed. Thus, a sensing unit 400 having increased sensitivity may be provided.

According to an embodiment of the inventive concept, light reflected from a fingerprint may be transmitted through the optical pattern layer and incident to the biometric information sensing layer. The incident angle of the light capable of being transmitted through the optical pattern layer may be restricted to be about equal to or less than a predetermined angle by the optical pattern layer. As the incident angle is restricted, the fingerprint recognition accuracy may be increased.

According to an embodiment of the inventive concept, the optical pattern layer may be provided through the dry etching. Thus, the size of the hole that is the light path may be precisely adjusted, and a sensing unit having increased sensitivity may be provided.

While the present inventive concept has been particularly shown and described with reference to the embodiments thereof, it will be understood by those of ordinary skill in the art that various changes in form and detail may be made therein without departing from the spirit and scope of the present inventive concept as defined by the following claims.

What is claimed is:
1. A display apparatus, comprising:
a biometric information sensing layer comprising a sensor and a transistor connected to the sensor;
a display module disposed on the biometric information sensing layer and comprising a plurality of pixels; and
an optical pattern layer disposed between the biometric information sensing layer and the display module and comprising a light shielding part and a transmission part,
wherein the light shielding part comprises a plurality of light shielding layers,
the transmission part has a light transmittance greater than a light transmittance of the light shielding part, and
a plurality of holes is defined in each of the light shielding layers, and
the light shielding layers are electrically insulated from each other,
wherein the sensor comprises:
a first sensing electrode;
a second sensing electrode disposed on the first sensing electrode; and
a sensing layer disposed between the first sensing electrode and the second sensing electrode,
wherein the sensing layer overlaps a portion of the transistor, and the sensing layer and the portion of the transistor overlap two or more of the plurality of holes at a location where the sensing layer overlaps the portion of the transistor.

2. The display apparatus of claim 1, wherein
the plurality of light shielding layers comprises a first light shielding layer, a second light shielding layer, and a third light shielding layer,
the plurality of holes comprises a plurality of first holes defined in the first light shielding layer, a plurality of second holes defined in the second light shielding layer, and a plurality of third holes defined in the third light shielding layer, and
the first holes, the second holes, and the third holes are aligned in a thickness direction of the light shielding part.

3. The display apparatus of claim 2, wherein the first to third holes have the same width as each other on a plane.

4. The display apparatus of claim 3, wherein the first to third holes have the same shape as each other on the plane.

5. The display apparatus of claim 2, wherein the first holes and the second holes have different widths from each other on a plane.

6. The display apparatus of claim 2, wherein the first holes and the second holes are arranged with a same pitch as each other.

7. The display apparatus of claim 5, wherein a width of each of the first holes is greater than each of a width of each of the second holes and a width of each of the third holes, and the width of each of the third holes is less than the width of each of the second holes.

8. The display apparatus of claim 1, wherein gaps between the light shielding layers are about the same as each other.

9. The display apparatus of claim 1, wherein gaps between the light shielding layers are different from each other.

10. The display apparatus of claim 1, wherein the light shielding part comprises at least one of molybdenum, titanium, or aluminum.

11. The display apparatus of claim 10, wherein each of the light shielding layers has a multi-layer structure.

12. The display apparatus of claim 1, wherein the light shielding part comprises chrome or carbon.

13. The display apparatus of claim 12, wherein a portion of the transmission part covers a top surface of the light shielding part.

14. A display apparatus, comprising:
a display module comprising a plurality of pixels; and
a sensing unit comprising a biometric information sensing layer disposed below the display module and comprising a sensor and a transistor connected to the sensor and an optical pattern layer disposed on the biometric information sensing layer,
wherein the optical pattern layer comprises:
a first light shielding layer in which a plurality of first holes overlapping in a plan view is defined;
a second light shielding layer in which a plurality of second holes overlapping the first holes, respectively, is defined;
a third light shielding layer in which a plurality of third holes overlapping the second holes, respectively, is defined; and
a transmission part disposed between the first to third light shielding layers,
wherein the transmission part fills each of the first to third holes,
wherein the sensor comprises:
a first sensing electrode;
a second sensing electrode disposed on the first sensing electrode; and
a sensing layer disposed between the first sensing electrode and the second sensing electrode,
wherein the sensing layer overlaps a portion of the transistor, and the sensing layer and the portion of the transistor overlap two or more of the plurality of holes at a location where the sensing layer overlaps the portion of the transistor, and
each of the first to third light shielding layers comprises at least one of molybdenum, titanium, or aluminum, and
the first to third light shielding layers are electrically insulated from each other.

15. The display apparatus of claim 14, wherein the transmission part has an integrated shape.

16. The display apparatus of claim 15, wherein the transmission part covers a top surface of the third light shielding layer.

17. The display apparatus of claim 14, wherein the first to third holes are aligned in a thickness direction of the first to third light shielding layers.

* * * * *